(12) United States Patent
Chang et al.

(10) Patent No.: US 12,745,424 B2
(45) Date of Patent: Sep. 22, 2026

(54) SEMICONDUCTOR STRUCTURE AND METHOD FOR MANUFACTURING THE SAME

(71) Applicant: TAIWAN SEMICONDUCTOR MANUFACTURING COMPANY, LTD., Hsinchu (TW)

(72) Inventors: Huang-Chao Chang, Hsinchu (TW); Ta-Chun Lin, Hsinchu (TW); Chun-Sheng Liang, Hsinchu (TW); Jhon-Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 614 days.

(21) Appl. No.: 18/172,877

(22) Filed: Feb. 22, 2023

(65) Prior Publication Data

US 2024/0162321 A1 May 16, 2024

Related U.S. Application Data

(60) Provisional application No. 63/425,054, filed on Nov. 14, 2022.

(51) Int. Cl.

*H10D 30/43* (2025.01)
*H10D 30/01* (2025.01)
*H10D 30/67* (2025.01)
*H10D 62/10* (2025.01)
*H10D 84/01* (2025.01)

(Continued)

(52) U.S. Cl.

CPC ....... *H10D 30/6735* (2025.01); *H10D 30/014* (2025.01); *H10D 30/43* (2025.01); *H10D 30/6757* (2025.01); *H10D 62/121* (2025.01); *H10D 84/0128* (2025.01); *H10D 84/0158* (2025.01); *H10D 84/038* (2025.01)

(58) Field of Classification Search

CPC .. H10D 30/6735; H10D 30/014; H10D 30/43; H10D 30/6757; H10D 62/121; H10D 62/364; H10D 84/0128; H10D 84/0151; H10D 84/0158; H10D 84/038; H10D 84/83

See application file for complete search history.

(56) References Cited

U.S. PATENT DOCUMENTS

2017/0110554 A1* 4/2017 Tak ...................... H10D 64/679
2018/0151450 A1* 5/2018 Ching ................ H10D 84/8311

(Continued)

*Primary Examiner* — Omar F Mojaddedi

(74) *Attorney, Agent, or Firm* — Cooper Legal Group, LLC

(57) ABSTRACT

A semiconductor structure includes a substrate, a dielectric wall, and two device units. The dielectric wall has two side surfaces opposite to each other. The two device units are respectively formed at the two side surfaces of the dielectric wall. Each of the device units includes channel features, a gate feature and a dielectric filler unit. The channel features are disposed on a corresponding one of the side surfaces of the dielectric wall, and spaced apart from each other. The gate feature is formed around the channel features and disposed on the corresponding one of the side surfaces of the dielectric wall. The dielectric filler unit includes a plurality of first dielectric fillers, each of which is disposed between the dielectric wall and a corresponding one of the channel features. The first dielectric fillers have a dielectric constant greater than that of the dielectric wall.

20 Claims, 22 Drawing Sheets

(51) Int. Cl.
*H10D 84/03* (2025.01)
*H10D 84/83* (2025.01)

(56) References Cited

U.S. PATENT DOCUMENTS

| | | | | |
|---|---|---|---|---|
| 2018/0240871 | A1* | 8/2018 | Cheng | H10D 62/822 |
| 2019/0115438 | A1* | 4/2019 | Ching | H10D 84/853 |
| 2021/0111185 | A1* | 4/2021 | Wang | H10D 64/037 |
| 2023/0089482 | A1* | 3/2023 | Zhang | H10D 84/85<br>257/213 |

* cited by examiner 12A
12A
21
17
21
121B
19
211
121B
161
211
121B
16
16
211
162
18
18
11A
10A
11A
Z
X
Y

SEMICONDUCTOR STRUCTURE AND METHOD FOR MANUFACTURING THE SAME

CROSS REFERENCE TO RELATED APPLICATION

This application claims the benefit of U.S. Provisional Patent Application No. 63/425,054, filed on Nov. 14, 2022, which is incorporated by reference herein in its entirety.

BACKGROUND

Forksheet field-effect transistors (FET) include nanosheet stacks that are separated by a wall structure. There is an urgent need for the industry to enhance the forksheet FETs in terms of improving gate control and minimizing leakage between different components of the forksheet FETs, so as to improve performance of the forksheet FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
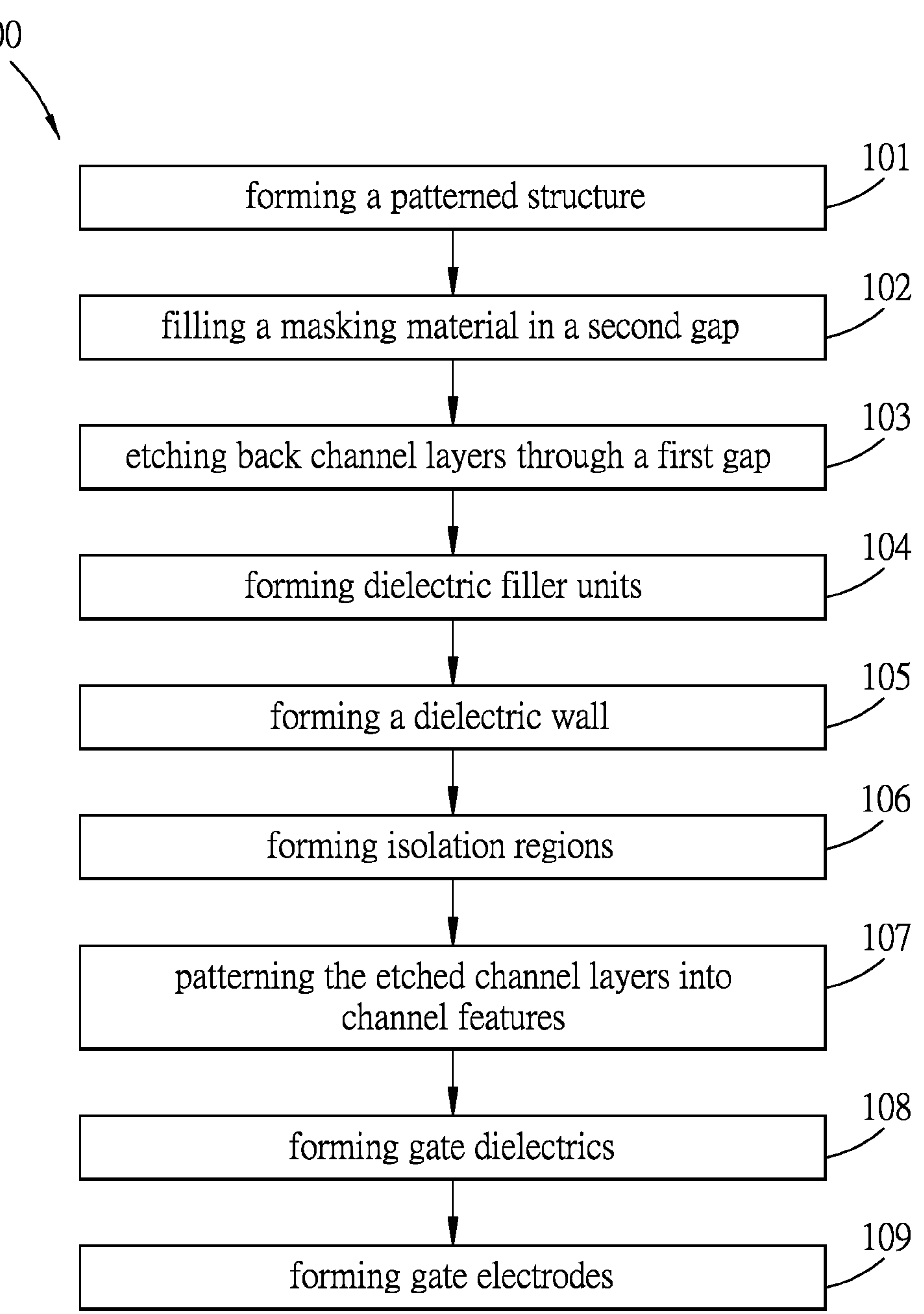
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "bottommost," "upper," "uppermost." "lower," "lowermost," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

The present disclosure is directed to a semiconductor structure that includes device units, a dielectric wall that separates the device units, and a plurality of dielectric fillers disposed between the dielectric wall and each of the device units; and a method for manufacturing thereof. Each of the device units includes a plurality of channel features, and the dielectric fillers are each disposed between a corresponding one of the channel features and the dielectric wall. As such, each of the channel features are spaced apart from the dielectric wall by a corresponding one of the dielectric fillers, instead of being directly disposed on the wall structure. The semiconductor structure further includes a gate feature that is formed around the channel features and that has an improved electrical field due to improved fringing effect, thereby having improved gate control over the channel features. The semiconductor structure may be configured as fork-sheet field-effect transistors (FETs), or other suitable configurations. The devices in the semiconductor structure may be integrated to function as memory cells, inverters, logic gates (e.g., NOR gates and NAND gates), or other suitable applications.

FIG. 1 is a flow diagram illustrating a method 100 for manufacturing the semiconductor structure (for example, the semiconductor structure 200 shown in FIG. 10) in accordance with some embodiments. FIGS. 2 to 13 illustrate schematic views of intermediate stages of the method 100 in accordance with some embodiments. Some repeating structures are omitted in FIGS. 2 to 13 for the sake of brevity. Additional steps can be provided before, after or during the method, and some of the steps described herein may be replaced by other steps or be eliminated.

Figure 2:
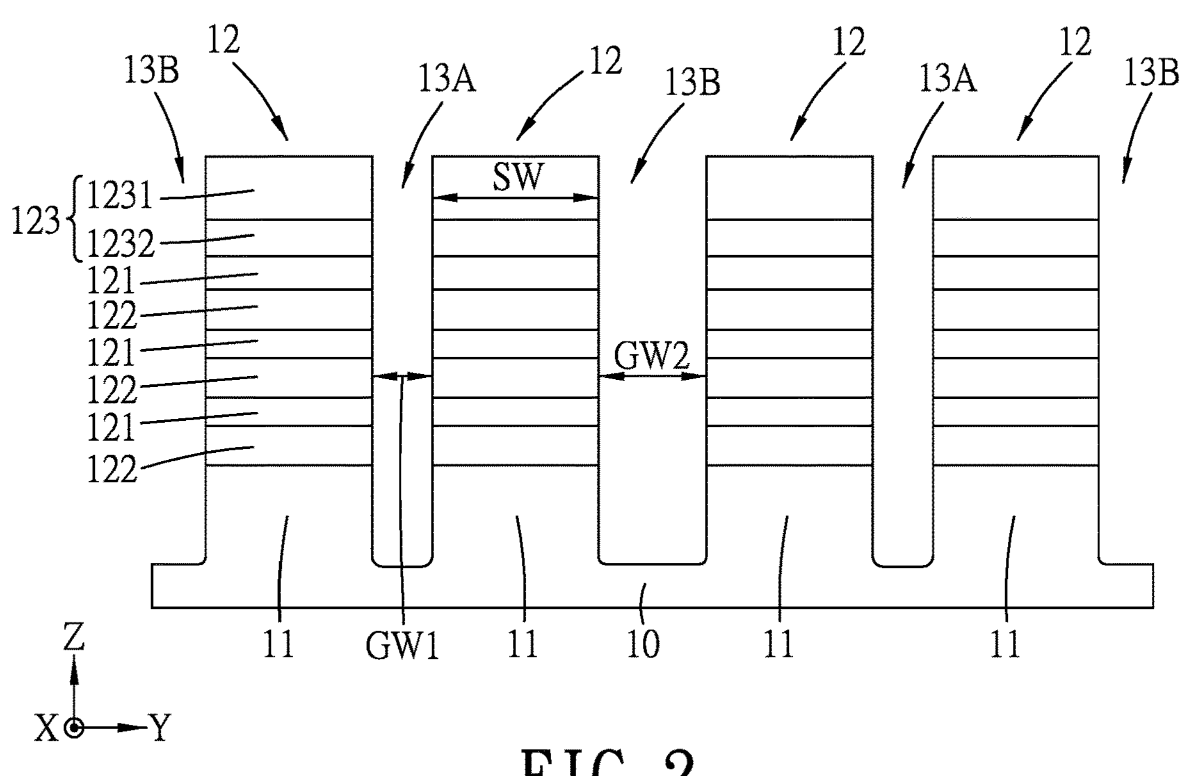
FIGS. 2 to 13 are schematic views illustrating intermediate stages of the method for manufacturing the semiconductor structure in accordance with some embodiments.

Referring to FIG. 1 and the example illustrated in FIG. 2, the method 100 begins at step 101, where a patterned structure is formed to include a substrate 10, a plurality of pairs of fins 11 (two pairs of the fins 11 are shown) disposed on the substrate 10, and a plurality of pairs of stacks 12 (two pairs of the stacks 12 are shown) disposed on a corresponding pair of the fins 11. In some embodiments, the fins 11 are each elongated in an X direction, and are spaced apart from each other in a Y direction transverse to the X direction.

In some embodiments, the substrate 10 may be, for example, but not limited to, a silicon-on-insulator (SOI) substrate, a germanium-on-insulator (GOI) substrate, a bulk semiconductor substrate (e.g., a bulk silicon substrate) or the like. The substrate 10 may have multiple layers. The substrate 10 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The substrate 10 may be intrinsic or doped with a dopant or different dopants. Other suitable materials and/or configurations for the substrate 10 are within the contemplated scope of the present disclosure.

Each of the fins 11 may be made of a material the same as or different from that of the substrate 10 as described above. The material for forming the fins 11 may be doped with p-type impurities or n-type impurities, or undoped. In some embodiments, when one of the fins 11 is designed for forming an n-type FET thereon, the one of the fins 11 may be doped with p-type impurities; and when one of the fins 11 is designed for forming a p-type FET thereon, the one of the fins 11 may be doped with n-type impurities so as to reduce a substrate leakage current.

Each of the stacks 12 includes a plurality of channel layers 121 and a plurality of sacrificial layers 122 disposed to alternate with the channel layers 121 in a Z direction transverse to both the X and Y directions. In some embodiments, the X, Y, and Z directions are perpendicular to one another. In some embodiments, an uppermost one of the channel layers 121 is disposed over an uppermost one of the sacrificial layers 121. The number of the channel layers 121 and the sacrificial layers 122 in each of the stacks 12 is determined according to application requirements. In FIG. 2, in each of the stacks 12, the number of the channel layers 122 and the number of the sacrificial layers 121 are both three. Suitable materials for the channel layers 121 and the sacrificial layers 122 are similar to those for the substrate 10, but the material of the channel layers 121 is different from that of the sacrificial layers 122, so that the sacrificial layers 122 can be selectively removed with respect to the material of the channel layers 121 during subsequent processes. In some embodiments, each of the channel layers 121 is made of silicon (Si), and each of the sacrificial layers 122 is made of silicon germanium (SiGe). Other suitable materials and/or configurations for the sacrificial layers 121 and the channel layers 122 are within the contemplated scope of the present disclosure.

In some embodiments, each of the stacks 12 has a stack width (SW) in the Y direction which may be adjustable and determined in step 101 and will affect a channel width (CW) in the Y direction of channel features 121B (see FIG. 10) to be subsequently formed from the channel layers 121. In some embodiments, the stack width (SW) ranges from about 5 nm to about 60 nm, and the channel width (CW) ranges from about 3 nm to about 55 nm. In addition, in each pair of the stacks 12, the stacks 12 are spaced apart from each other by a first gap 13A which has a gap width (GW1) that is greater than about 0 nm and less than about 35 nm in the Y direction. Each two adjacent pairs of the stacks 12 are spaced apart from each other by a second gap 13B (GW2) which has a gap width greater than about 35 nm in the Y direction.

In some embodiments, each of the stacks 12 further includes a mask layer 123 disposed on the uppermost one of the channel layers 121. The mask layer 123 may include at least one low k material (such as silicon oxide, silicon nitride, silicon oxynitride, silicon carbonitride, silicon oxycarbide, silicon oxycarbonitride, silicon carbide, and so on), at least one high k material (such as hafnium oxide, zirconium oxide, zirconium aluminum oxide, hafnium aluminum oxide, hafnium silicon oxide, aluminum oxide, and so on), or combinations thereof. In some embodiments, the mask layer 123 includes an upper mask film 1231 and a lower mask film 1232 which is made of a material different from that of the upper mask film 1231. In some embodiments, the lower mask film 1232 includes silicon nitride and the upper mask film 1231 includes an oxide-based material (such as silicon oxide, hafnium oxide, and so on). Other suitable materials and/or configurations for the mask layer 123 are within the contemplated scope of the present disclosure.

In some embodiments, the patterned structure may be formed by patterning a semiconductor substrate and a stack unit (not shown) formed thereon to form the fins 11 on the substrate 10 and the stacks 12 respectively on the fins 11 (i.e., the semiconductor substrate is patterned into the substrate 10 and the fins 11, and the stack unit is patterned into the stacks 12). Other suitable processes and/or configurations for the patterned structure are within the contemplated scope of the present disclosure. In the following steps and drawings, a single pair of the fins 11 and a single pair of the stacks 12 are further illustrated for the sake of brevity.

Figure 3:
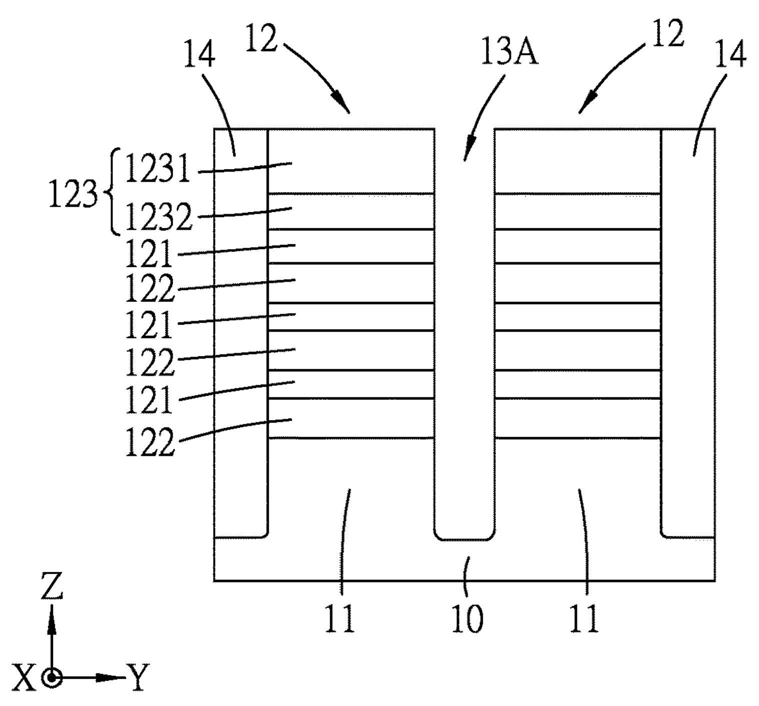

Referring to FIG. 1 and the example illustrated in FIG. 3, the method 100 proceeds to step 102, where a masking material layer 14 is formed to fill the second gaps 13B between each two adjacent pairs of the stacks 12 (see also FIG. 2) and to expose the first gap 13A.

In some embodiments, the masking material layer 14 may include oxides, nitrides, a carbon-based material, or a polymer. In some embodiments, the polymer may include, for example, but not limited to a bottom anti-reflective coating (BARC). In some embodiments, the BARC is prepared from 4-vinylphenol monomers (to form polyvinylphenol polymer) or styrene monomers (to form polystyrene polymer). Other suitable materials for forming the masking material layer 14 are within the contemplated scope of the present disclosure.

In some embodiments, the masking material layer 14 may be formed by sub-steps of: (i) forming a material layer for forming the masking material layer 14 using a suitable process, such as chemical vapor deposition (CVD), atomic layer deposition (ALD), spin coating, and/or other suitable techniques; and (ii) patterning the material layer to expose the first gap 13A between each pair of the stacks 12 to thereby form the masking material layer 14.

Figure 4:
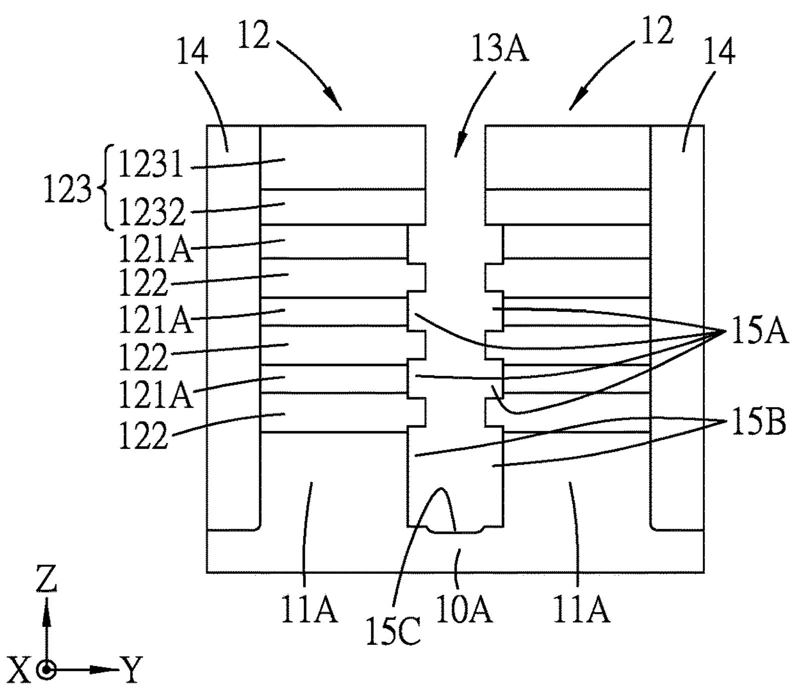

Referring to FIG. 1 and the example illustrated in FIG. 4, the method 100 proceeds to step 103, where the channel layers 121 of each of the stacks 12 shown in FIG. 3 are etched back through the first gap 13A to form first lateral recesses 15A. In some embodiments, in step 103, a wet etchant, which has a higher etching selectivity to the channel layers 121 than to the sacrificial layers 122, is used. In some embodiments, the fins 11 shown in FIG. 3 are also etched back by the wet etchant through the first gap 13A to form second lateral recesses 15B. In some embodiments, the substrate 10 shown in FIG. 3 is also etched by the wet etchant through the first gap 13A to form a lower recess 15C between each pair of the fins 11. After step 103, the remaining channel layers are denoted by 121A, the remaining fins are each denoted by 11A, and the remaining substrate is denoted by 10A.

Figure 5:
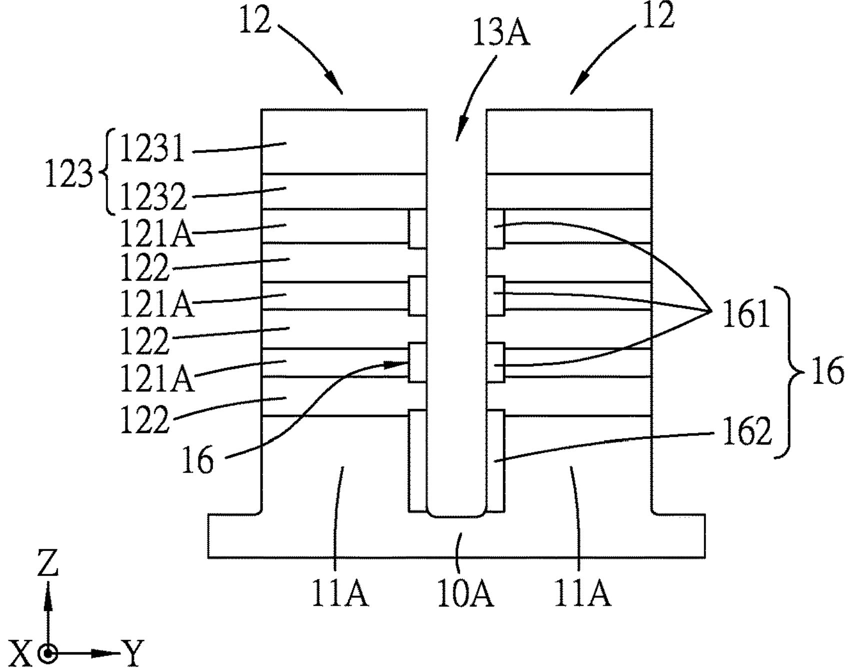

Referring to FIG. 1 and the example illustrated in FIG. 5, the method 100 proceeds to step 104, where a plurality of dielectric filler units 16 are formed.

In some embodiments, each of the dielectric filler units 16 includes a plurality of first dielectric filers 161 that are respectively formed in the first lateral recesses 15A of a corresponding one of the stacks 12 as shown in FIG. 4. In some embodiments, each of the dielectric filler units 16 further includes a second dielectric filler 162 formed in the second lateral recess 15B of a corresponding one of the fins 11A as shown in FIG. 4.

In some embodiments, the dielectric filler units 16 have a dielectric constant greater than about 7, and may include silicon carbon nitride, silicon nitride (e.g., $Si_3N_4$), aluminum oxide (e.g., $Al_2O_3$), hafnium (IV) silicate (e.g., $HfSiO_4$), yttrium oxide (e.g., $Y_2O_3$), hafnium oxide (e.g., $HfO_2$), zirconium oxide (e.g., $ZrO_2$), tantalum oxide (e.g., $Ta_2O_5$), lanthanum oxide (e.g., $La_2O_3$), lanthanum aluminate (e.g., $LaAlO_3$), niobium oxide (e.g., $Nb_2O_5$), titanium oxide (e.g., $TiO_2$), barium titanate (e.g., $BaTiO_3$), strontium titanate (e.g., $SrTiO_3$), or combinations thereof. Other suitable materials and/or configurations for the dielectric fillers 16 are within the contemplated scope of the present disclosure.

In some embodiments, the dielectric filler units 16 are formed by sub-steps of: (i) depositing a first dielectric material for forming the dielectric fillers 16 over the structure shown in FIG. 4 using CVD, ALD, or other suitable techniques; (ii) performing an anisotropic etching process to remove horizontal portions of the first dielectric material (such as portions of the first dielectric materials on the masking material layer 14 and the mask layers 123 of the stacks 12, and in the lower recess 15C) such that the remaining first dielectric material has a plurality of portions which respectively fill the first and second lateral recesses 15A, 15B to serve as the first and second dielectric fillers 161, 162; and (iii) removing the masking material layer 14.

Figure 6:
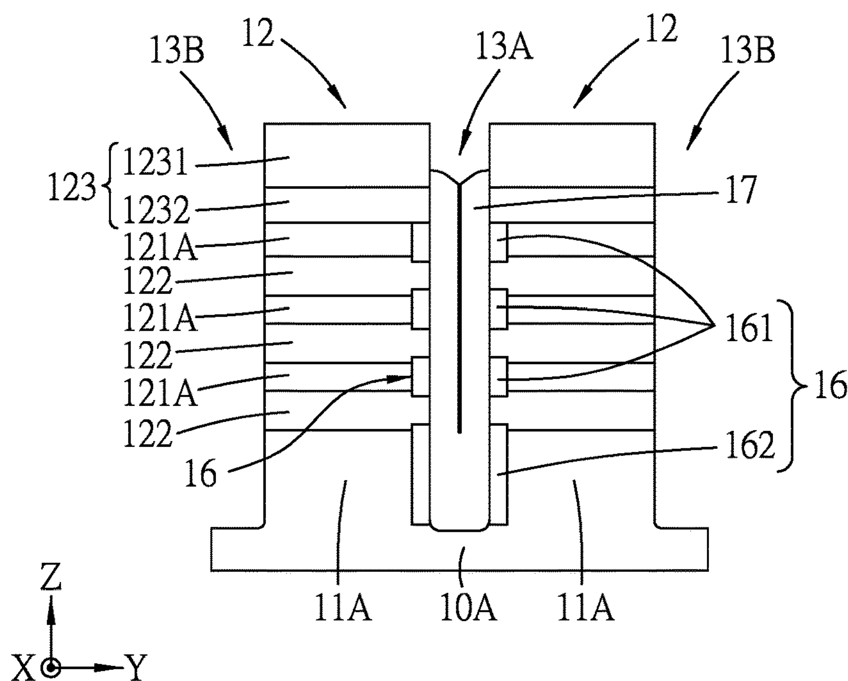

Referring to FIG. 1 and the example illustrated in FIG. 6, the method 100 proceeds to step 105, where a dielectric wall 17 is formed to fill in the first gap 13A such that each of the channel layers 121A is separated from the dielectric wall 17 through a corresponding one of the first dielectric fillers 161 of the dielectric filler units 16, and each of the fins 11A is spaced apart from the dielectric wall 17 by the second dielectric filler 162 of a corresponding one of the dielectric filler units 16.

In some embodiments, the dielectric wall 17 has a dielectric constant not greater than 7. In some embodiments, the dielectric wall 17 may be formed by depositing a material for forming the dielectric wall 17 in the gap 13A, followed by an etching back process to remove a portion of the deposited material. The deposition—etching back process is then repeated, so as to obtain a high quality dielectric wall 17.

Figure 7:
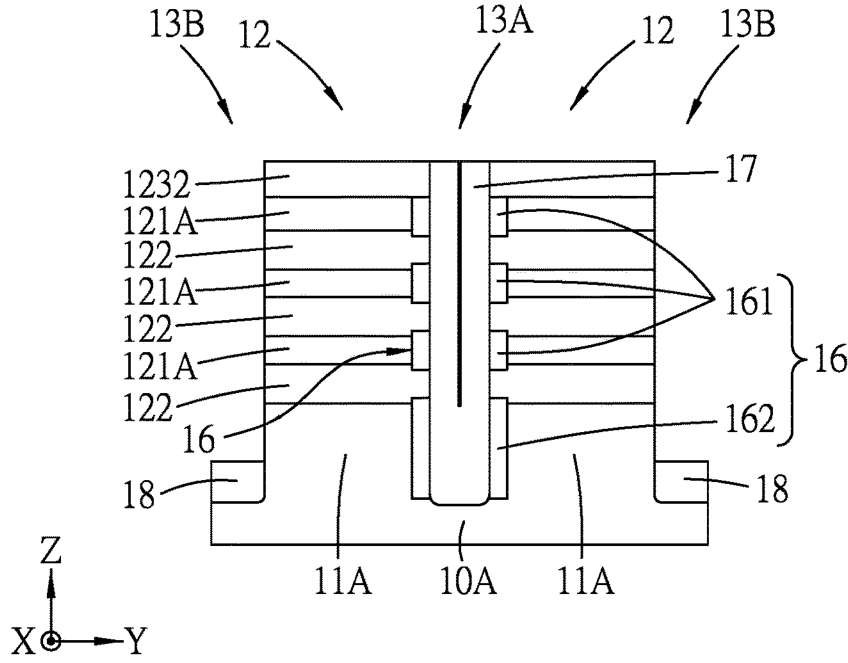

Referring to FIG. 1 and the example illustrated in FIG. 7, the method 100 proceeds to step 106, where a plurality of isolation regions 18 are respectively formed in the second gaps 13B between each adjacent pairs of the fins 11A.

In some embodiments, each of the isolation regions 18 may be a portion of a shallow trench isolation (STI), a deep trench isolation (DTI), or other suitable structures. The isolation regions 18 may include a suitable low k material (such as the examples described in the preceding paragraph). Other suitable materials and/or configurations for the isolation regions 18 are within the contemplated scope of the present disclosure.

In some embodiments, the isolation regions 18 may be formed by the following sub-steps: (i) filling an isolation material (not shown) for forming the isolation regions 18 in the second gaps 13B using any suitable deposition process, such as CVD; (ii) removing an excess of the isolation material by for example, but not limited to, a chemical-mechanical planarization (CMP) process, other suitable techniques, or combinations thereof; and (iii) etching back the remaining isolation material, thereby obtaining the isolation regions 18. In some embodiment, during removing the excess of the isolation material, the upper mask film 1231 is also removed to expose the lower mask film 1232. Other suitable process for forming the isolation regions 18 are within the contemplated scope of the present disclosure.

Figures 8, 9:
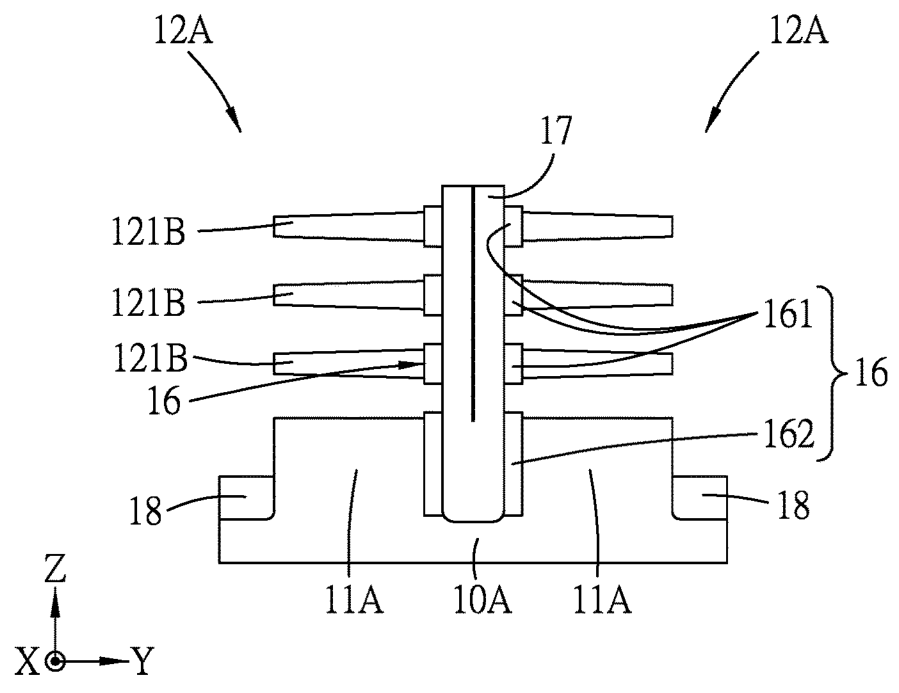

Referring to FIG. 1 and the example illustrated in FIG. 8, the method 100 proceeds to step 107, where the two stacks 12 are patterned after forming the dielectric wall 17 such that the etched channel layers 121A are formed into channel features 121B and the sacrificial layers 122 are removed.

To obtain the structure shown in FIG. 8, in some embodiments, step 107 may include following sub-steps: (i) removing the lower mask film 1232 shown in FIG. 7; (ii) forming a dummy gate structure (not shown) which is elongated in the Y direction over the stacks 12 shown in FIG. 7, the dummy gate structure may include a dummy gate dielectric and a dummy gate electrode; (iii) forming a pair of gate spacers 171 (see also FIGS. 12 and 13) at two opposite sides of the dummy gate structure; (iv) etching portions of each of the stacks 12 which are exposed from the dummy gate structure and the gate spacers 171 to form source/drain recesses (not shown), the etched channel layers 121A and the sacrificial layers 122 in each of the stacks 12 being patterned into channel features 121B (see FIG. 8) and sacrificial features (not shown); (v) replacing end portions of the sacrificial features with a plurality of inner spacers 172 (see also FIG. 13); (vi) forming source/drain features 173 (see also FIG. 13) respectively in the source/drain recesses; (vii) forming a contact etch stop layer 174 and an interlayer dielectric layer 175 over each of the source/drain features; and (viii) removing the dummy gate electrode, the dummy gate dielectric and the remaining sacrificial features. The stacks are then denoted as 12A. Other suitable processes for forming the structure shown in FIG. 8 are within the contemplated scope of the present disclosure.

Referring to FIG. 1 and the example illustrated in FIG. 9, the method 100 proceeds to step 108, where two gate dielectrics 21, each of which is formed over a corresponding one of the stacks 12A, a corresponding side surface of the dielectric wall 17, a corresponding one of the fins 11A and a corresponding one of the isolation regions 18. Each of the gate dielectrics 21 has a plurality of dielectric portions 211 disposed to alternate with the channel features 121B of a corresponding one of the stacks 12A.

In some embodiments, the gate dielectrics 21 are made of a high dielectric constant material, such as the dielectric material having a dielectric constant ranging from 7 to 25. In other embodiments, the gate dielectrics 21 are made of, for example, but not limited to, Hf-based dielectric materials, Zr-based dielectric materials, AI-based dielectric materials, Ti-based dielectric materials, Ba-based dielectric materials, nitrides, or the like, or combinations thereof. In some embodiments, the gate dielectrics 21 may be formed using CVD, PVD, or other suitable techniques. Other suitable materials and processes for forming the gate dielectrics 21 are within the contemplated scope of the present disclosure.

In some embodiments, prior to forming the gate dielectrics 21, a plurality of interfacial layers 19 are respectively formed around the channel features 121B of a corresponding one of the stack 12A, and the gate dielectrics 21 are each formed over the interfacial layers 19 on the corresponding stack 12A. The interfacial layers 19 may serve as a buffer layer for facilitating growth of a layer to be subsequently formed thereon, and may be made of a suitable low dielectric constant material such as silicon oxide, silicon nitride, silicon oxynitride, or combinations thereof. In some embodiments, the interfacial layers 19 are formed using CVD, ALD, thermal oxidation, or wet chemical oxidation. Other suitable techniques and materials for forming the interfacial layers 19 are within the contemplated scope of the present disclosure.

Figure 10:
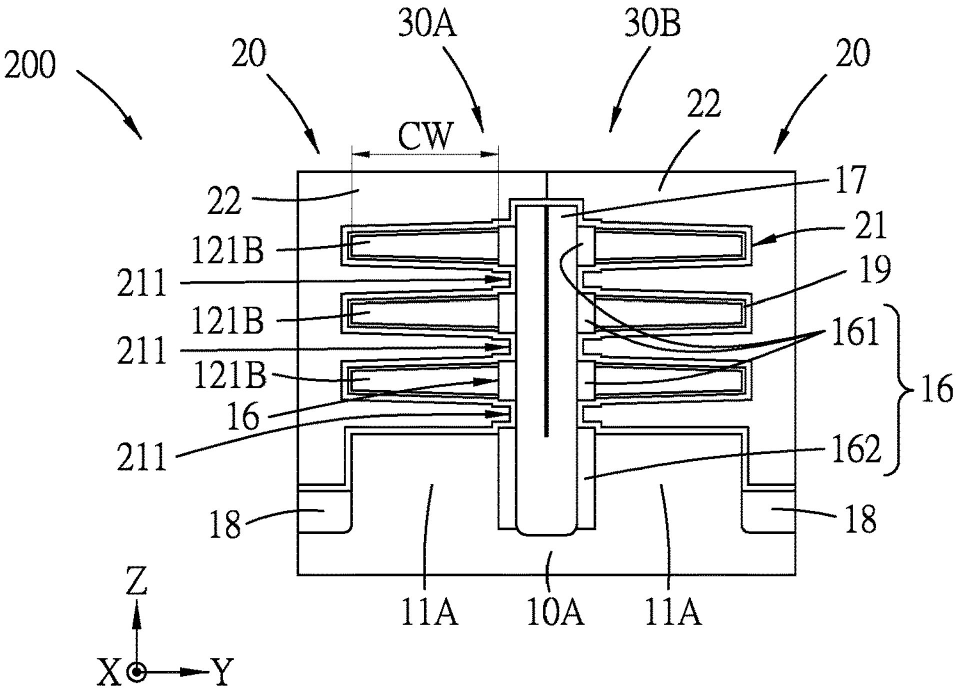

Referring to FIG. 1 and the example illustrated in FIG. 10, the method 100 proceeds to step 109, where two gate electrodes 22, each of which is formed over a corresponding one of the stacks 12A and disposed on a corresponding one of side surfaces of the dielectric wall 17. Each of the gate electrodes 22 is separated from the channel features 121B of the corresponding stack 12A (see also FIG. 9) and the dielectric wall 17 by a corresponding one of the gate dielectrics 21. Each of the gate electrodes 22 and the corresponding one of the gate dielectrics 21 form a gate feature 20 around the channel features 121B of the corresponding stack 12A.

In some embodiments, the two gate electrodes 22 may be made of the same or different materials. For instance, one of the gate electrodes 22 may serve as a gate electrode of an n-type device, and the other one of the gate electrodes 22 may serve as a gate electrode of a p-type device. In some embodiments, the gate electrodes 22 are merged on an upper surface of the dielectric wall 17. The gate electrodes 22 may include a conductive material such as, for example, but not limited to, a metal (e.g., copper, aluminum, titanium, tantalum, cobalt, tungsten, or the like, or alloys thereof), polysilicon, metal-containing nitrides (e.g., TaN), metal-containing silicides (e.g., NiSi), metal-containing carbides (e.g., TaC), or the like, or combinations thereof. Other suitable materials for forming the gate electrodes 22 are within the contemplated scope of the present disclosure.

In some embodiments, when the two gate electrodes 22 are different materials, step 109 may include sub-steps of: (i) depositing a first electrode material (for example, the material for forming left one of the gate electrodes 22 shown in FIG. 10) over the two stacks 12A using CVD, ALD or other suitable techniques; (ii) performing a planarization process such as CMP or other suitable techniques; (iii) forming a mask (not shown) on a left portion of the planarized first electrode material and over the left one of the stacks 12A that is to be formed with the left one of the gate electrode 22, exposing a right portion of the planarized first electrode material; (iv) removing the right portion of the planarized first electrode material deposited over the right one of the stacks 12A; (v) depositing a second electrode material over the right one of the stacks 12A and the left portion of the planarized first electrode material using CVD, ALD or other suitable techniques; and (vi) removing an excess of the second electrode material using, for example, CMP to expose the left portion of the planarized first electrode material. In some other embodiments, the second electrode material may be deposited, planarized and partially removed first, and then the first electrode material is deposited and partially removed. Other suitable techniques for forming the gate electrodes 22 are within the contemplated scope of the present disclosure.

Figure 11:
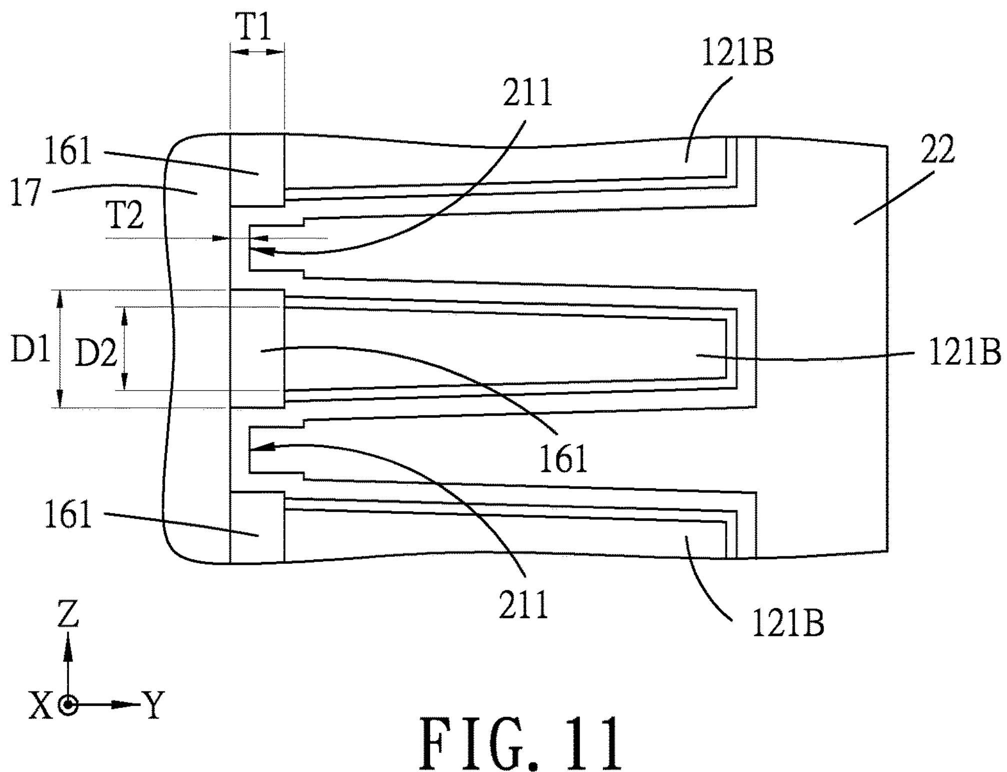
Figure 12:
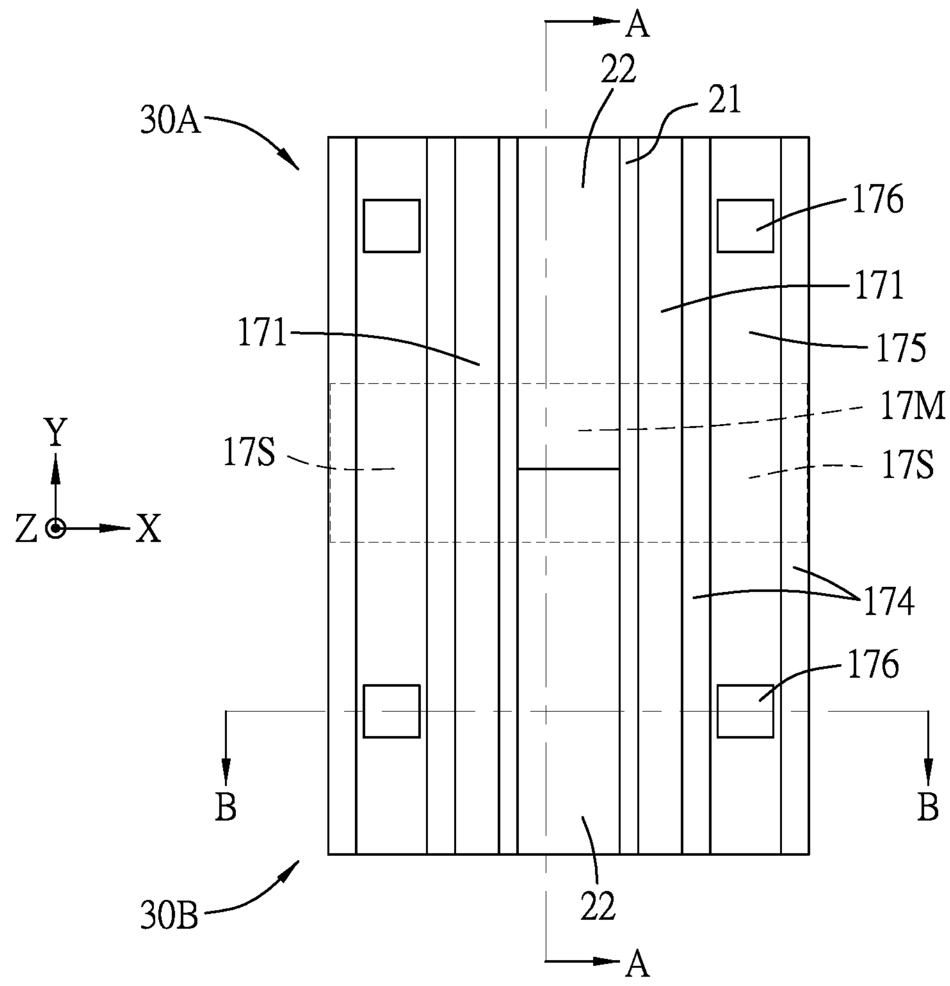
Figure 13:
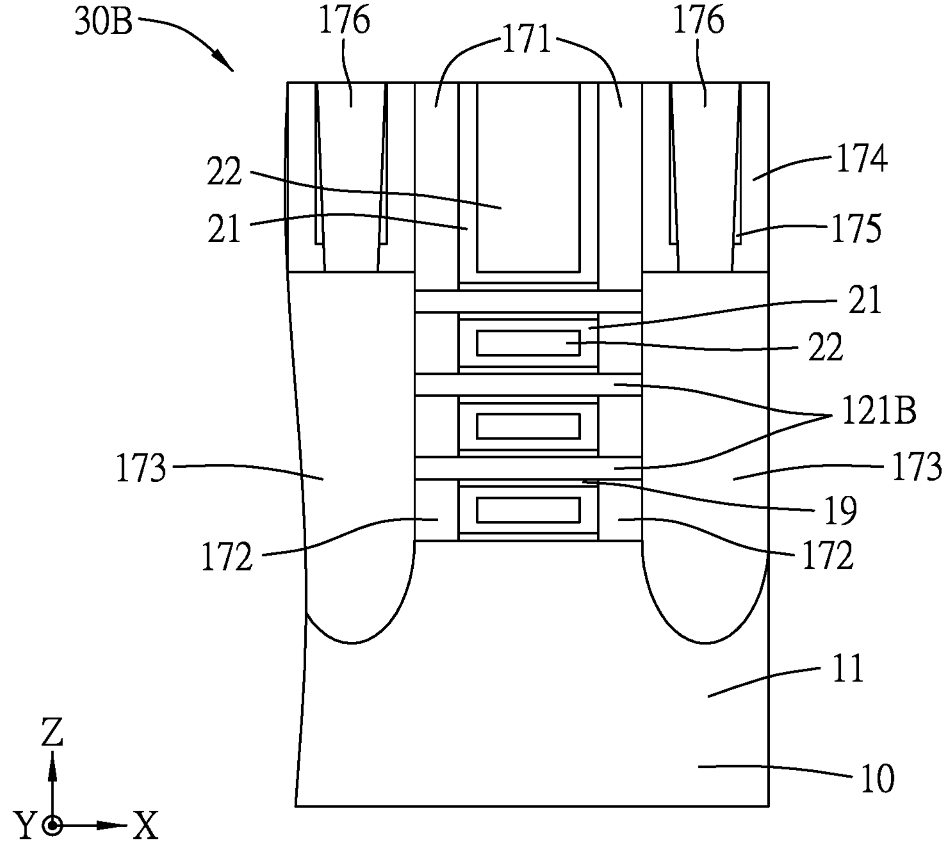

After completing step 109, the semiconductor structure 200 is obtained. FIG. 11 is a partially enlarged view of FIG. 10 in accordance with some embodiments. FIG. 12 shows a top view of the semiconductor structure 200 in accordance with some embodiments. In some embodiments, a cross-sectional view of the semiconductor structure 200 along the line A-A of FIG. 12 is illustrated in FIG. 10, and a cross-sectional view of the semiconductor structure 200 along the line B-B of FIG. 12 is illustrated in FIG. 13. The semiconductor structure 200 includes the substrate 10A, the dielectric wall 17, and two device units 30A, 30B that are respectively formed at the two side surfaces of the dielectric wall 17. In some embodiments, one of the device units 30A, 30B may serve as the n-type device, and the other one of the device units 30A, 30B may serve as the p-type device. Each of the device units 30A, 30B includes the corresponding channel features 121B, the corresponding gate feature 20 and the corresponding dielectric filler unit 16 that are disposed on a corresponding one of the side surfaces of the dielectric wall 17. In some embodiments, the method may further include a step of forming metal-to-device (MD) contacts 176 (see FIGS. 12 and 13). Each of the MD contacts 176 is in electrically contact with a corresponding one of the source/drain features 173 of the first and second device units 30A, 30B, and each of the source/drain features 173 may refer to a source or a drain, individually or collectively dependent upon the context. In some embodiments, the dielectric wall 17 has a middle portion 17M on which the two gate electrodes 22 are merged (see FIG. 10) and two side portions 17S which are at two opposite sides of the middle portion 17M. Although not shown in figures, each of the side portions 17S is disposed to separate one of the source/drain features 173 of the first device unit 30A from a corresponding one of the source/drain features 173 of the second device unit 30B.

In each of the device units 30A, 30B, the channel features 121B are spaced apart from each other in the Z direction, and each of the first dielectric fillers 161 of the dielectric filler unit 16 is disposed between the dielectric wall 17 and a corresponding one of the channel features 121B. In some embodiments, each of the first dielectric fillers 161 is in direct contact with an end portion of the corresponding channel feature 121B. Referring to FIG. 11, each of the first dielectric fillers 161 has a first maximum dimension (D1) in the Z direction greater than a second maximum dimension (D2) of the end portion of the corresponding channel feature 121B in the Z direction. In some embodiments, the first maximum dimension (D1) is greater than the second maximum dimension (D2) by at least about 1.5 nm. In some embodiments, a difference between the first maximum dimension (D1) and the second maximum dimension (D2) ranges from about 1.5 nm to about 5 nm. In other embodiments, the difference between the first maximum dimension (D1) and the second maximum dimension (D2) ranges from about 1.5 nm to about 3 nm. In some embodiments, the first maximum dimension (D1) ranges from about 6.5 nm to about 11 nm, and the second maximum dimension (D2) ranges from about 5 nm to about 8 nm. In addition, the first dielectric fillers 161 are disposed to alternate with the dielectric portions 211 of the gate feature 20 in the Z direction. Each of the dielectric portions 211 has a dielectric thickness (T2), and each of the first dielectric fillers 161 has a maximum thickness (T1) in the Y direction transverse to the Z direction, which is not less than the dielectric thickness (T2) of each of the dielectric portions 211. In some embodiments, the maximum thickness (T1) is greater than the dielectric thickness (T2). In some embodiments, the maximum thickness (T1) ranges from about 2 nm to about 5 nm, and the dielectric thickness (T2) ranges from about 1 nm to about 2 nm. With such configuration, each of the channel features 121B is spaced apart from the dielectric wall 17 by the corresponding first dielectric filler 161 (i.e., each of the channel features 121B is spaced apart from the dielectric wall 17 by the maximum thickness (T1)), so as to allow enhanced fringing effect to each of the channel features 121B. To be specific, through the introduction of the first dielectric fillers 161, each of the dielectric portions 211 which covers the corresponding channel feature 121B and extends toward the dielectric wall 17, can extend beyond the end portion of the corresponding channel feature 121B. Therefore, in each of device units 30A, 30B, each of the channel features 121B, especially the end portion thereof, can be precisely controlled (e.g., switched on/off) by the gate electrode 22, thereby reducing a current leakage from the end portion of each of the channel features 121B. The enhanced fringing effect is conducive to improvement of gate control over the channel features 121B, resulting in reduced short channel effect (SCE) such as improved drain-induced barrier lowering (DIBL) and reduced subthreshold swing. In addition, with the provision of the first and second dielectric fillers 161, 162, the dielectric wall 17 and the sources and drains are less likely to be damaged in sub-step (vii) of step 107 of removing the remaining sacrificial features, so extrusion of the gate features into the dielectric wall 17, or direct contact between the channel features 121B and the dielectric wall 17 are less likely to occur, since the dielectric wall 17 has substantially the same thickness throughout the entire manufacturing process. Moreover, during sub-step (iv) of step 109 of removing the right portion of the first electrode material to create the space for deposition of the second electrode material, since the right portion of the planarized first electrode material to be removed has a smallest dimension at positions most proximate to the dielectric wall 17 (i.e., the positions between each two adjacent ones of the channel features 121B of the left one of the stacks 12A or the position between the right one of the fins 11A and the lowermost one of the channel features 121B of the left one of the stacks 12A), the structure shown in FIG. 9 allows the removal process to be performed more readily and thoroughly, so as to minimize retention of any undesirable residues, e.g. the first electrode material.

Figure 14:
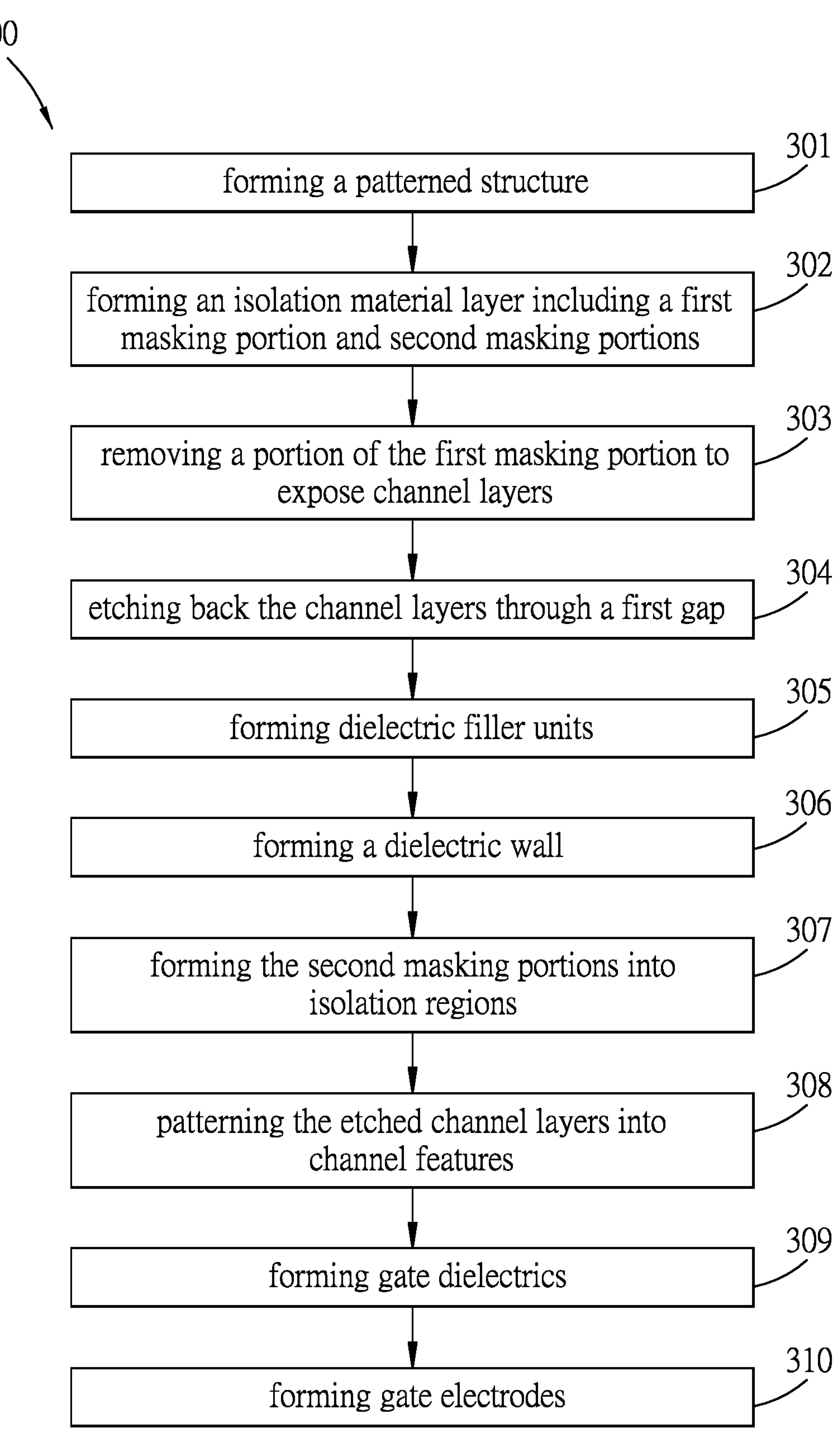
FIG. 14 is a flow diagram illustrating an another method for manufacturing the semiconductor structure in accordance with some embodiments.

The semiconductor structure of the present disclosure, e.g., the semiconductor structure 200 shown in FIG. 10, may also be manufactured using an another method 300 in accordance with some embodiments. FIG. 14 is a flow diagram illustrating the method 300 for manufacturing the semiconductor structure 200 in accordance with some embodiments. FIGS. 15 to 20 illustrate schematic views of intermediate stages of the method 300 in accordance with some embodiments. Some repeating structures are omitted in FIGS. 15 to 20 for the sake of brevity. Additional steps can be provided before, after or during the method, and some of the steps described herein may be replaced by other steps or be eliminated.

Referring to FIG. 14, the method 300 begins at step 301, which is similar to step 101 of the method 100, where the patterned structure described with reference to FIG. 2 is formed. Other details regarding the patterned structure are not repeated for the sake of brevity. In the following steps and drawings, a single pair of the fins 11 and a single pair of the stacks 12 are further illustrated for the sake of brevity.

FIGS. 15 to 20 illustrates intermediate stages of the method 300 which are subsequent to step 301 with reference to the structure shown in FIG. 2 and which are respectively obtained in steps 302 to 307 in accordance with some embodiments.

Figure 15:
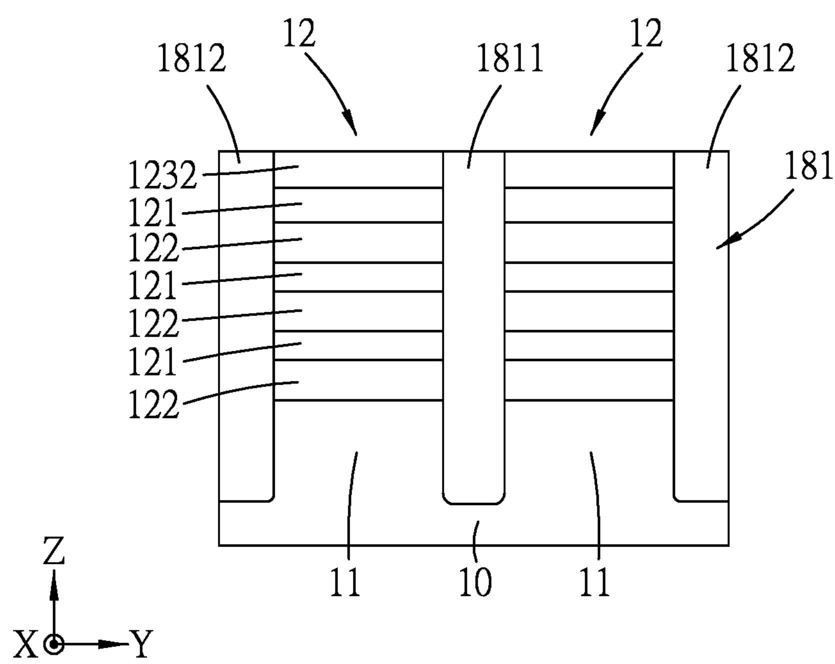
FIGS. 15 to 36 are schematic views illustrating intermediate stages of the another method for manufacturing the semiconductor structure in accordance with some embodiments.

Referring to FIG. 14 and the example illustrated in FIGS. 2 and 15, the method 300 proceeds to step 302, where an isolation material layer 181 is formed. The isolation material layer 181 includes a first masking portion 1811 filling the first gap 13A, and two second masking portions 1812 respectively filling the second gaps 13B.

The isolation material layer 181 may include an oxide material, such as silicon oxide, but is not limited thereto. In some embodiments, step 302 includes the sub-steps of: (i) filling an isolation material for forming the isolation material layer 181 in the first gap 13A and the second gaps 13B using any suitable deposition process, such as CVD; and (ii) removing an excess of the isolation material by for example, but not limited to, CMP, other suitable techniques, or combinations thereof, so as to obtain the isolation material layer 181. In some embodiments, during removing the excess of the isolation material, the upper mask film 1231 shown in FIG. 2 is also removed to expose the lower mask film 1232. Other suitable process for forming the isolation material layer 181 are within the contemplated scope of the present disclosure. In some embodiments, the isolation material layer 181 is flush with an upper surface of the lower mask layer 1232.

Figure 16:
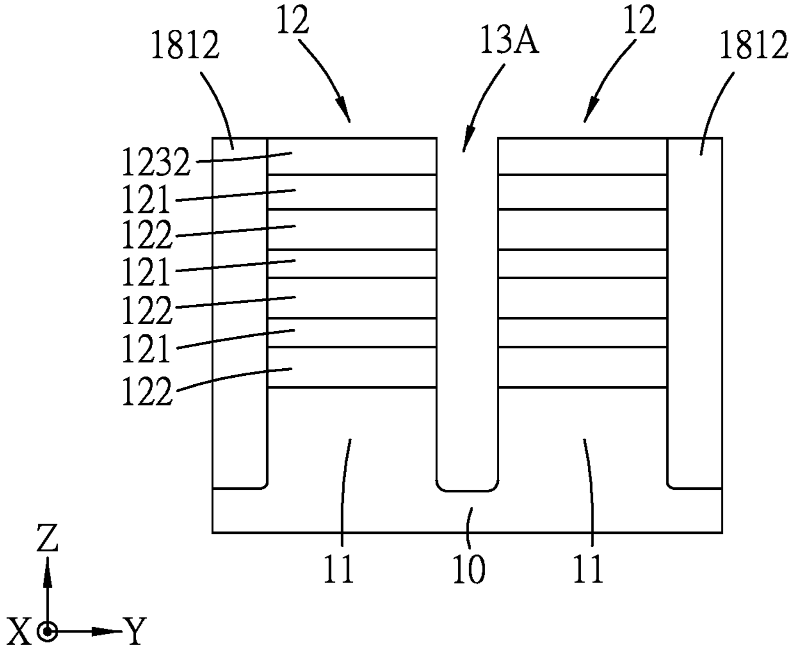

Referring to FIG. 14 and the example illustrated in FIG. 16, the method 300 proceeds to step 303, where a portion of the first masking portion 1811 is removed to expose the channel layers 121. In some embodiments, the entire first masking portion 1811 is removed.

In some embodiments, the isolation material layer 181 is patterned so as to remove the first masking portion 1811. In some embodiments, a wet etching process, but is not limited thereto, is used, and a wet etchant used has a higher etching selectivity to the the isolation material layer 181 than to the lower mask layer 1232, the channel layers 121, and the sacrificial layers 122. Other suitable process for removing the first masking portion 1811 are within the contemplated scope of the present disclosure. This step exposes the channel layers 121 so as to facilitate steps performed subsequently.

Figure 17:
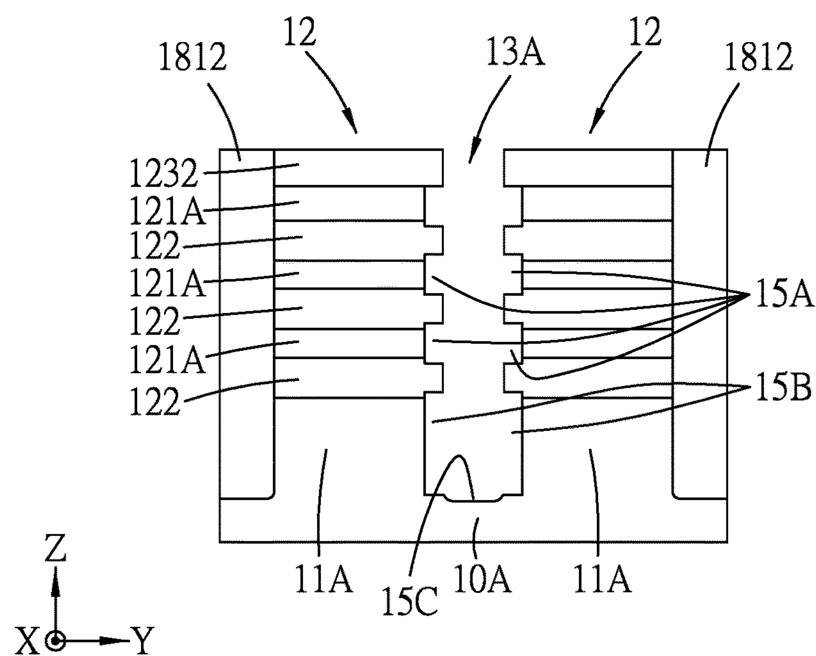

Referring to FIG. 14 and the examples illustrated in FIGS. 16 and 17, the method 300 proceeds to step 304 which is similar to step 103 of the method 100 with reference to FIG. 4, where the channel layers 121 of each of the stacks 12, the fins 11, and the substrate 10 are etched back through the first gap 13A to respectively form the first lateral recesses 15A, the second lateral recesses 15B, and the lower recess 15C. Other details regarding the etching back process are omitted for the sake of brevity.

Figure 18:
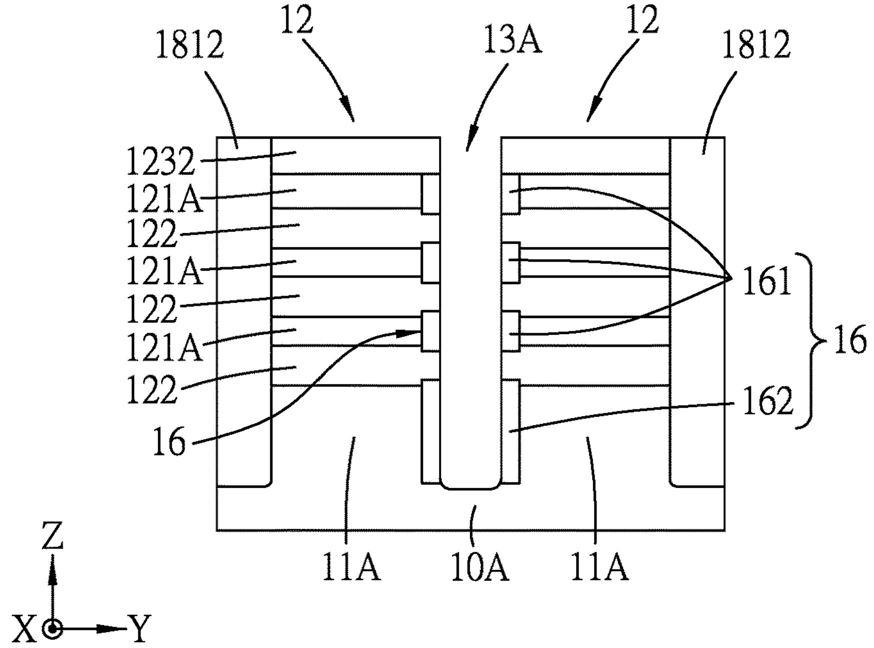

Referring to FIG. 14 and the example illustrated in FIG. 18, the method 300 proceeds to step 305, which is similar to step 104 of the method 100 with reference to FIG. 5, where a plurality of the dielectric filler units 16 are formed. The dielectric filler units 16 each includes a plurality of the first dielectric filers 161 that are respectively formed in the first lateral recesses 15A of a corresponding one of the stacks 12, and the second dielectric filler 162 formed in the second lateral recess 15B of the corresponding one of the fins 11A. Other details regarding formation of the dielectric filler units 16 are omitted for the sake of brevity.

Figure 19:
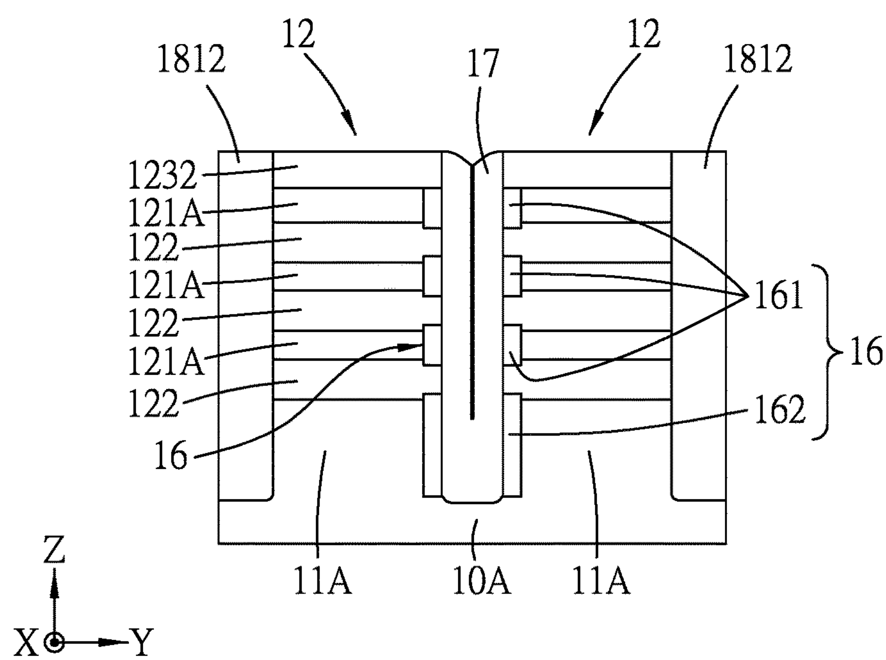

Referring to FIG. 14 and the example illustrated in FIG. 19, the method 300 proceeds to step 306, which is similar to step 105 of the method 100 with reference to FIG. 6, where the dielectric wall 17 is formed to fill in the first gap 13A such that each of the channel layers 121A is separated from the dielectric wall 17 through a corresponding one of the first dielectric fillers 161 of the dielectric filler units 16. Other details regarding formation of the dielectric wall 17 are omitted for the sake of brevity.

Figure 20:
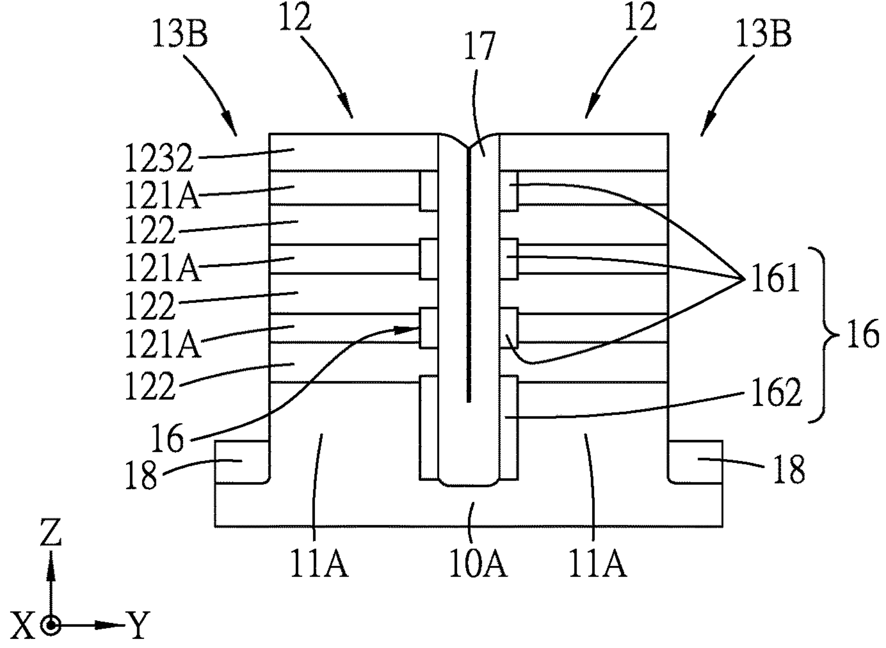

Referring to FIG. 14 and the example illustrated in FIG. 20, the method 300 proceeds to step 307, where a portion of each of the second masking portions 1812 of the isolation material layer 181 are removed so as to form the isolation regions 18 in the second gaps 13B between each adjacent pairs of the fins 11A. In some embodiments, the removal of the portion of each of the second masking portions 1812 may be performed by any suitable processes such as a selective etching process for selectively etching back of the second masking portions 1812 or other suitable techniques. When the selective etching process is used, the isolation material layer 181 formed in step 302 (see also FIG. 15) is made of a material different from a material of the lower mask film 1232 and a material of the dielectric wall 17. The structure obtained after completing step 307 of the method 300 is similar to the structure obtained after completing step 106 of the method 100 with reference to FIG. 7, except that for the structure shown in FIG. 20, the dielectric wall 17 may not be flush with the lower mask layer 1232.

The remaining steps 308 to 310 are respectively similar to steps 107 to step 109 with references to FIGS. 8 to 10. Since steps 308 to 310 are performed in a manner similar to those described with reference to FIGS. 8 to 10, details thereof are not repeated for the sake of brevity.

In the method 300, the isolation material layer 181, in which the second masking portion 1812 are utilized as a masking material over the second gaps 13B, so that formation of the dielectric filler units 16 and the dielectric wall 17 are performed over the first gap 13A, rather than over the second gap 13B. In addition, the second masking portion 1812 may be directly and readily formed into the isolation regions 18. In comparison with the masking material of the method 300, in the method 100, the masking material layer 14 serves as the masking material to facilitate formation of the dielectric filler units 16 and the dielectric wall 17, and is removed prior to formation of the dielectric wall 17. Both methods 100 and 300 are capable of achieving the semiconductor structure of the present disclosure, e.g., the semiconductor structure 200 as shown in FIG. 10, along with the advantageous effects provided thereby.

Figure 29:
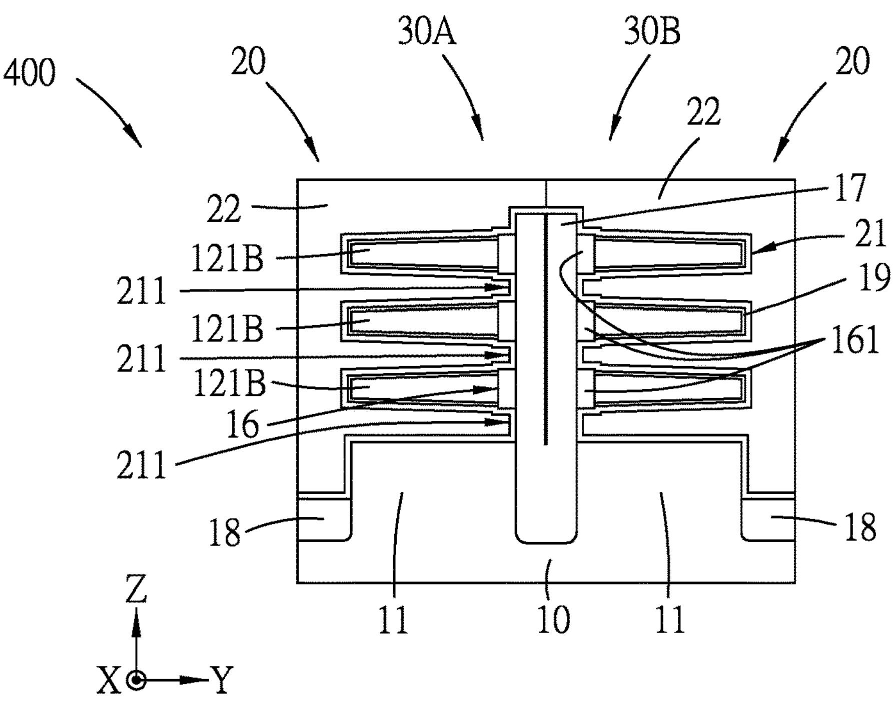

In accordance with some other embodiments, the method 300 may be modified as method 300A to obtain a semiconductor structure 400 shown in FIG. 29. Intermediate stages of the method 300A which are subsequent to the structure shown in FIG. 15 obtained in step 302 of the method 300 are illustrated in FIGS. 21 to 29 (i.e., steps 301 to 302 of the method 300A are similar to steps 301 to 302 of the method 300). The method 300A is similar to the method 300, except the following differences.

Figure 21:
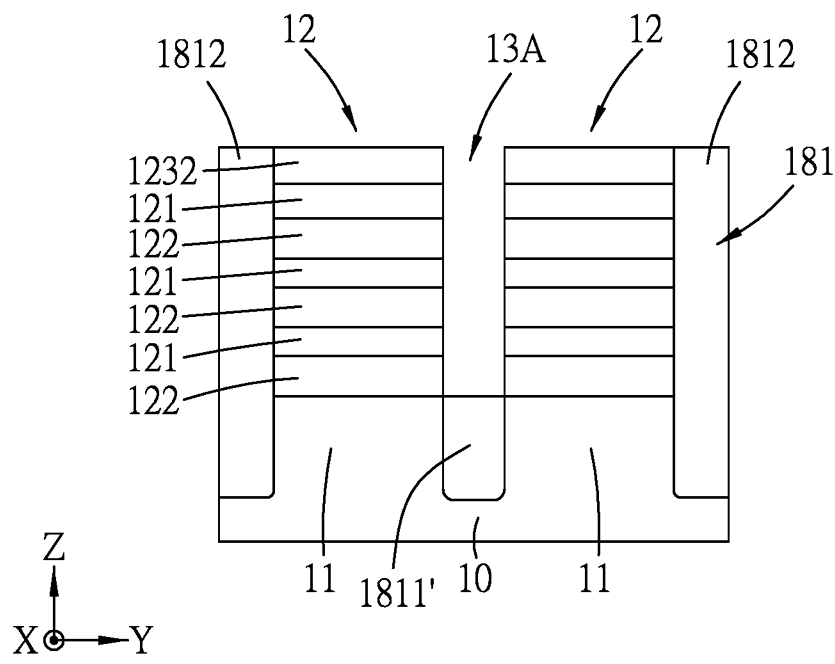

Referring to FIG. 14 and the example illustrated in FIG. 21, step 303 of the method 300A is similar to step 303 of the method 300 with reference to FIG. 16, except that a portion of the first masking portion 1811 is removed, leaving a remaining portion of the first masking portion 1811' in the first gap 13A. As such, the channel layers 121 are exposed, while the fins 11 and the substrate 10 are covered by the first masking portion 1811'. Other details regarding the removal of the portion of the first masking portion 1811 are not repeated for the sake of brevity.

Figure 22:
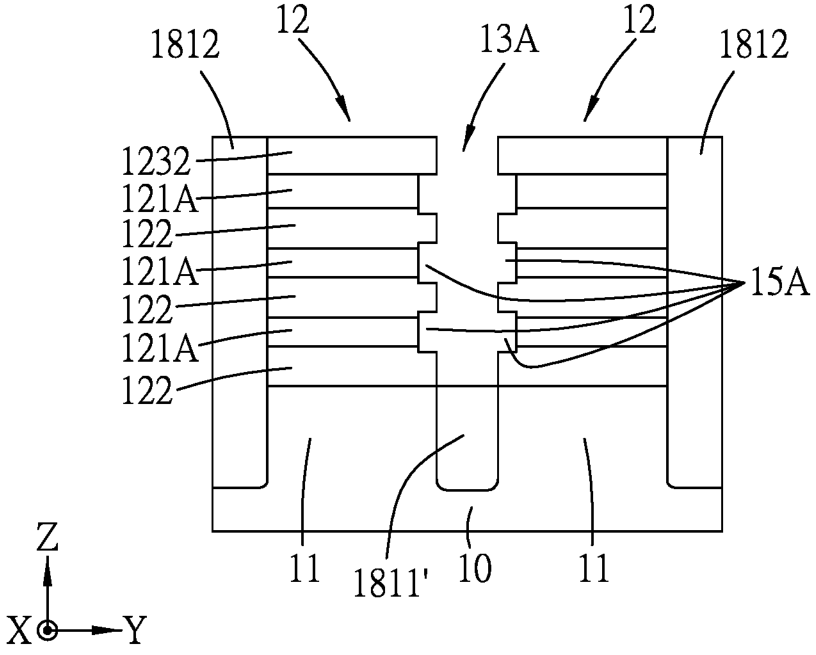

Referring to FIG. 14 and the example illustrated in FIG. 22, step 304 of the method 300A is similar to step 304 of the method 300 with reference to FIG. 17, except that the channel layers 121 that are exposed from the remaining portion of the first masking portion 1811' are etched back through the first gap 13A to form the first lateral recesses 15A in each of the stacks 12, while the fins 11 and the substrate 10 that are covered, are not etched and remain intact. Other details regarding the etching process are not repeated for the sake of brevity.

Figure 23:
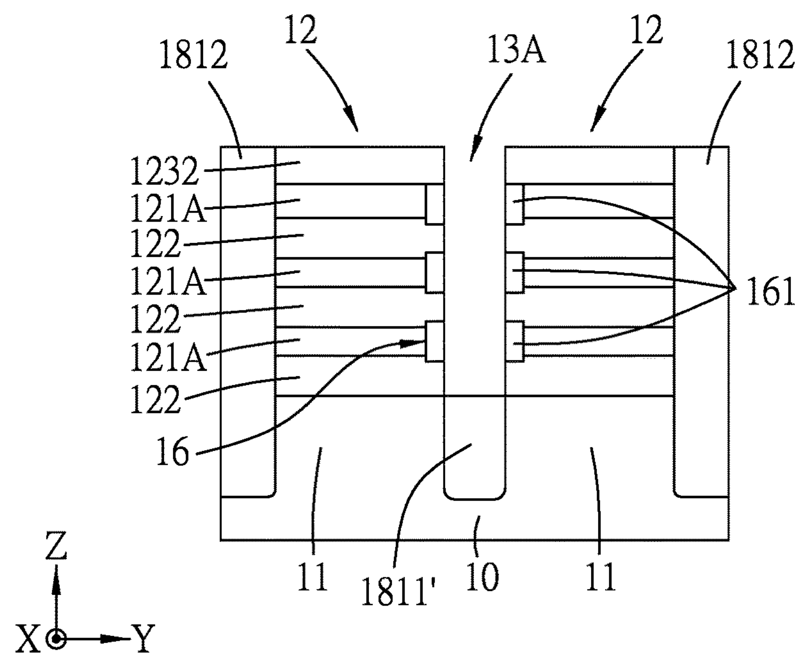

Referring to FIG. 14 and the example illustrated in FIG. 23, step 305 of the method 300A is similar to step 305 of the method 300 with reference to FIG. 18, except that each of the dielectric filler units 16 formed includes the first dielectric filers 161 that are respectively formed in the first lateral recesses 15A of a corresponding one of the stacks 12, while the second dielectric fillers 162 are not formed. Other details regarding formation of the dielectric filler units 16 are omitted for the sake of brevity.

Figure 24:
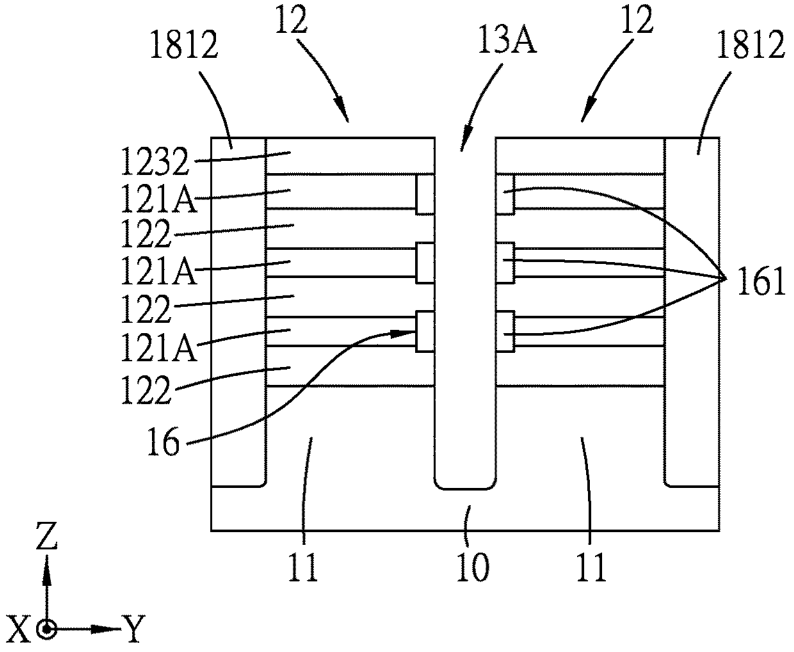

Referring to the example illustrated in FIG. 24, after forming the dielectric filler units 16 (i.e., step 305) and prior to forming the dielectric wall 17 (i.e., step 306), in some embodiments, the method 300A may further include an additional step of removing the remaining portion of the first masking portion 1811' from the first gap 13A. In some other embodiments, the additional step may be omitted.

Figure 25:
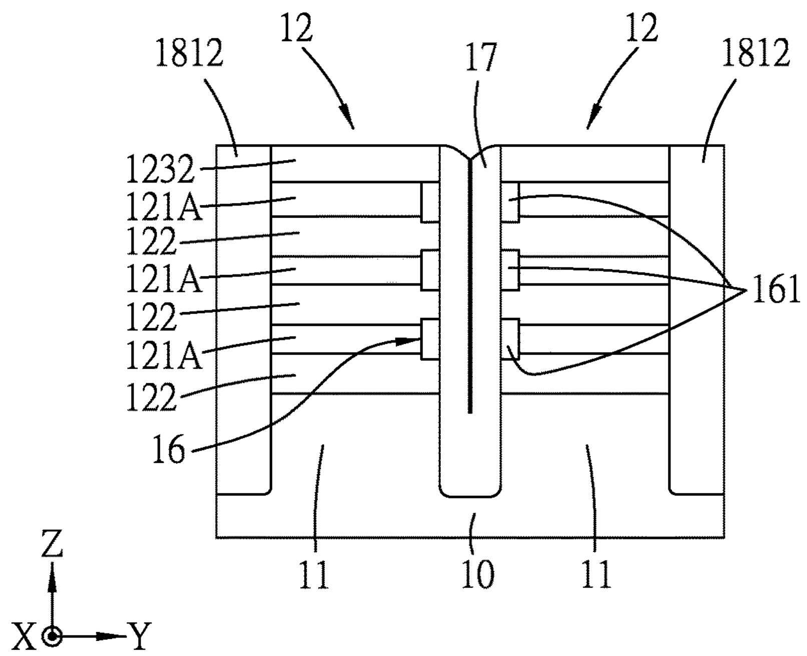
Figure 26:
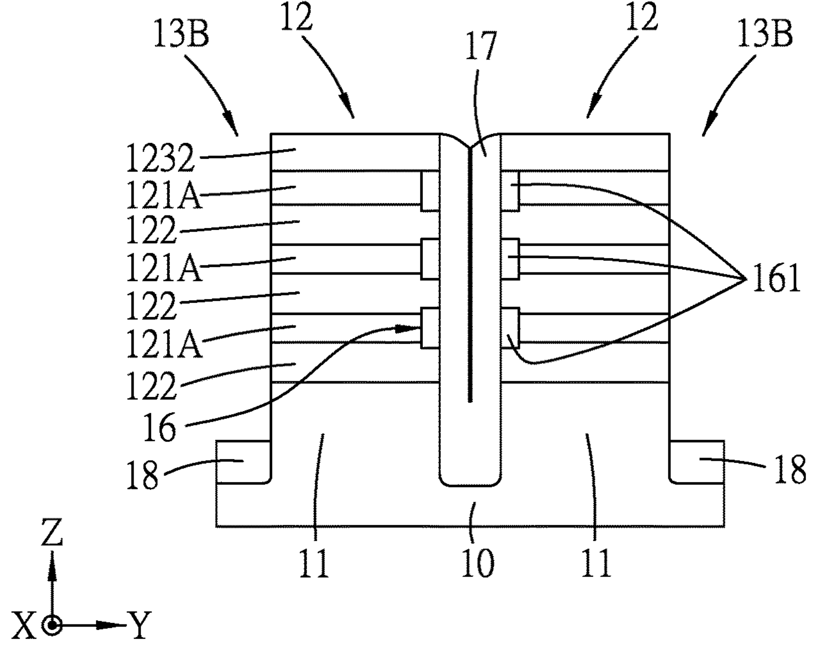
Figure 27:
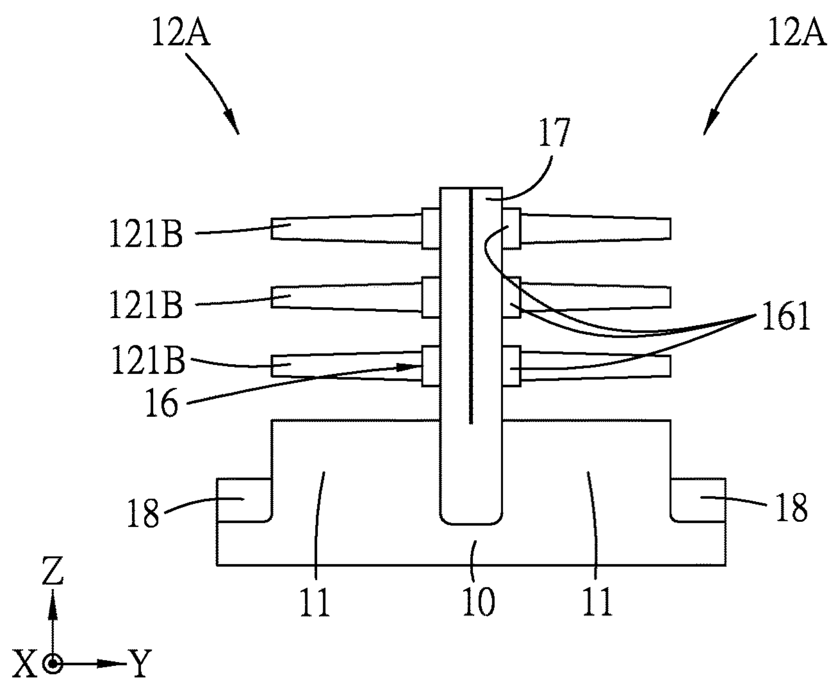
Figure 28:
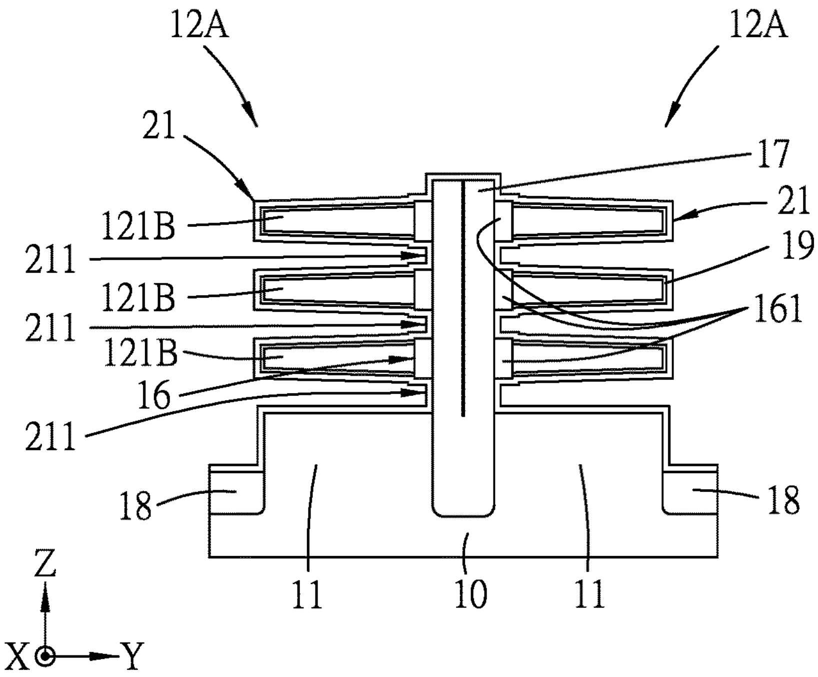

Referring to FIG. 14 and the example illustrated in FIG. 25, step 306 of the method 300A is similar to step 306 of the method 300 with reference to FIG. 19, except that for the structure obtained shown in FIG. 25, each of the side surfaces of the dielectric wall 17 formed is in direct contact with a corresponding one of the fins 11. Other details regarding formation of the dielectric wall 17 are omitted for the sake of brevity.

FIGS. 26 to 29 illustrate intermediate stages which are subsequent to that shown in FIG. 25 and which are respectively obtained in steps 307 to 310 of the method 300A in accordance with some embodiments. Since steps 307 to 310 with reference to FIGS. 26 to 29 are performed in a manner similar to those described with reference to FIGS. 20, 8, 9 and 10, details thereof are not repeated for the sake of brevity.

The method 300A differs from the method 300 in that the removal of the portion of the first masking portion 1811 is performed before forming the dielectric filler units 16, and the removal of the remaining portion of the first masking portion 1811' is performed after forming the dielectric filler units 16, thereby obtaining the semiconductor structure 400 shown in FIG. 29. In contrast, in the method 300, the removal of the portion of the first masking portion 1811 and the remaining portion of the first masking portion 1811', i.e., the entire first masking portion 1811, is performed before forming the dielectric filler units 16, thereby obtaining the semiconductor structure 200 shown in FIG. 10. The semiconductor structure 400 differs from the semiconductor structure 200 in that, for the semiconductor structure 400, the second dielectric fillers 162 are not formed, and each of the fins 11 is in direct contact with the corresponding one of the side surfaces of the dielectric wall 17, while for the semiconductor structure 200, the second dielectric fillers 162 are formed, such that each of the fins 11A are spaced apart from the corresponding one of the side surfaces of the dielectric wall 17 by a corresponding one of the second dielectric fillers 162.

Figure 35:
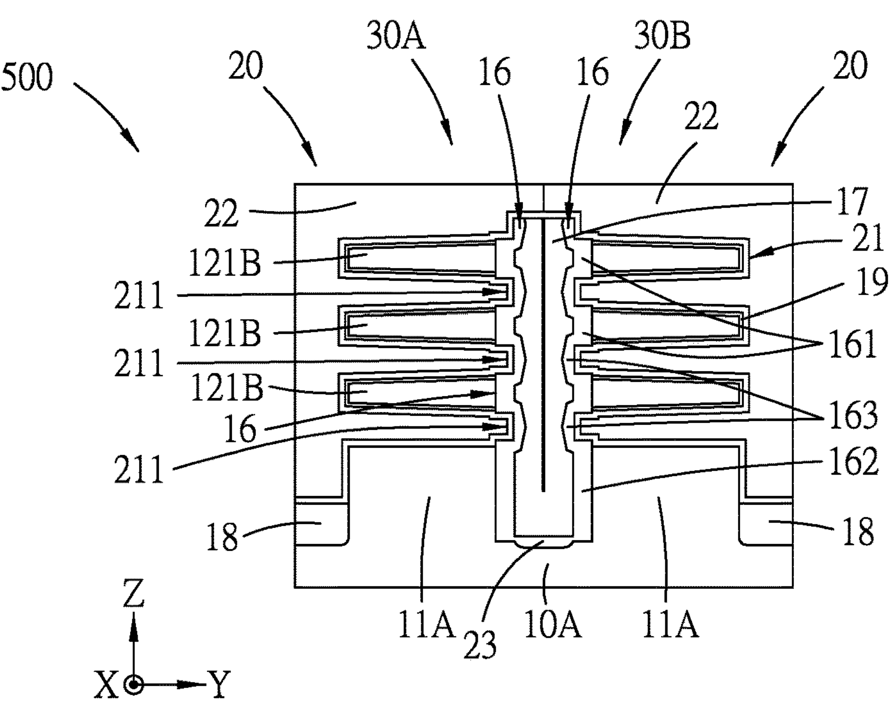

In accordance with yet other embodiments, the method 300 may be modified as method 300B to obtain a semiconductor structure 500 shown in FIG. 35. Intermediate stages of the method 300B which are subsequent to the structure shown in FIG. 17 obtained in step 304 of the method 300 are illustrated in FIGS. 30 to 36 (i.e., steps 301 to 304 of the method 300B are similar to steps 301 to 304 of the method 300). The method 300B is similar to the method 300, except the following differences.

Figure 30:
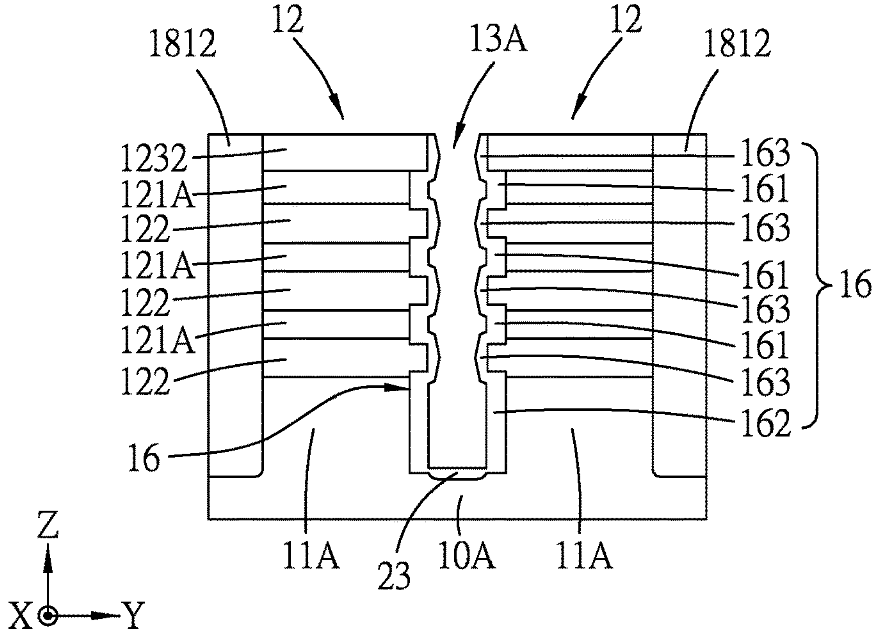
Figure 31:
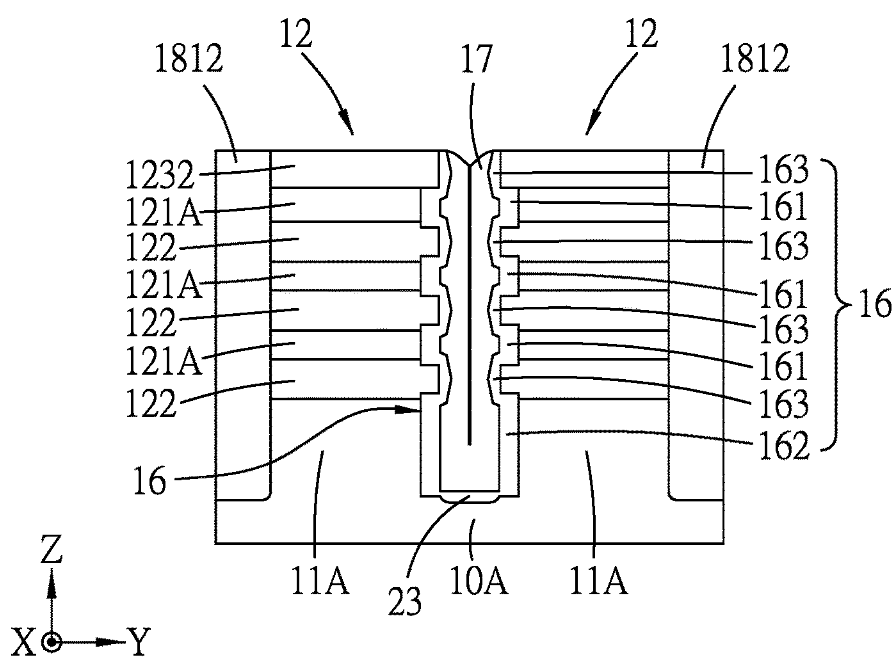
Figure 32:
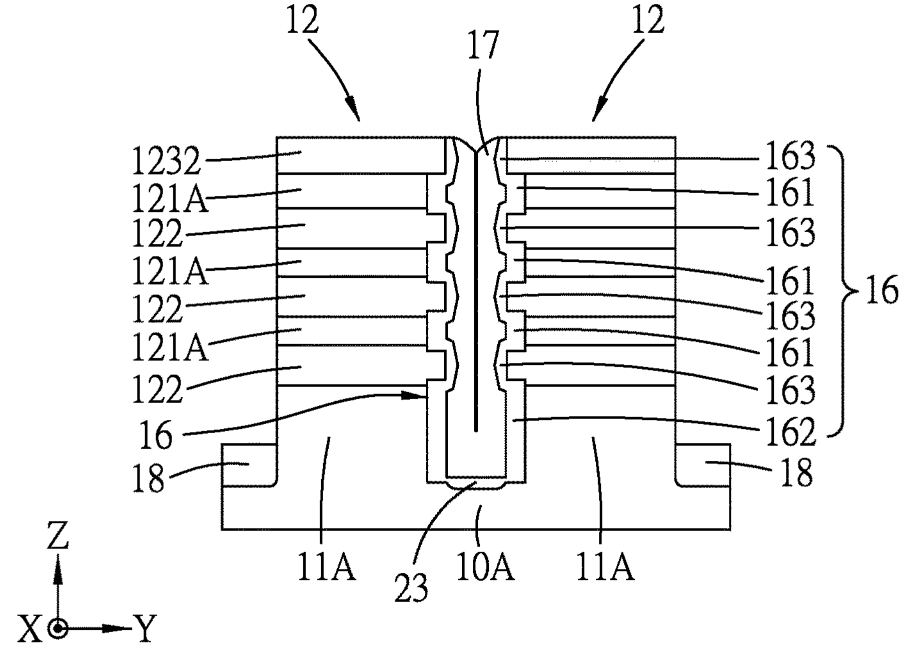
Figure 33:
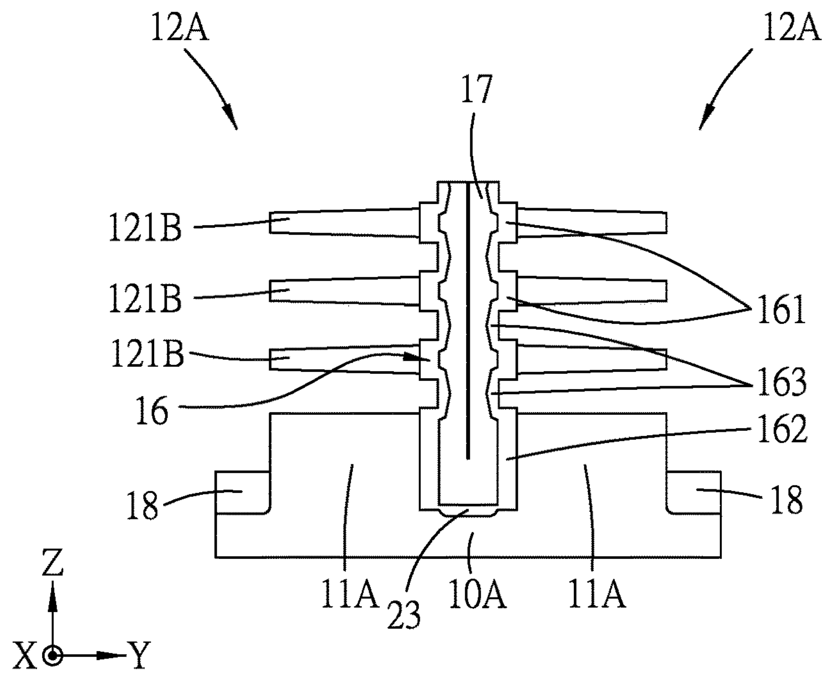
Figure 34:
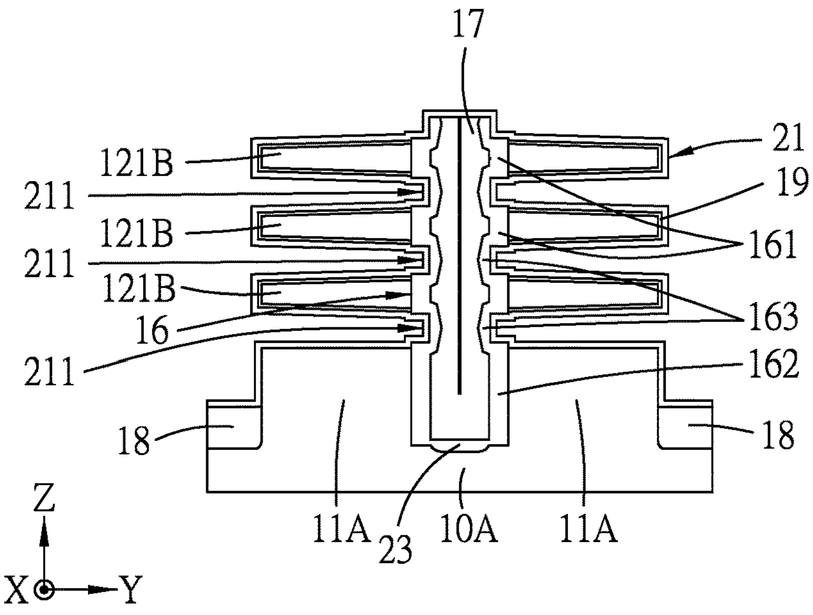

Referring to FIG. 14 and the example illustrated in FIG. 30, step 305 of the method 300B is similar to step 305 of the method 300 with reference to FIG. 18, except that each of the dielectric filler units 16 formed further includes a plurality of connecting portions 163 disposed to alternate with, and connected with the first dielectric fillers 161. A bottommost one of the connecting portion 163 interconnects the second dielectric filler 162 and a bottommost one of the first dielectric fillers 161. In addition, a dielectric connecting feature 23 which is made of a material the same as that of the dielectric filler units 16 and which interconnects the second dielectric fillers 162 of the dielectric filler units 16 are formed. As such, the dielectric filler units 16 and the dielectric connecting feature 23 between each pair of the fins 11A form a continuous structure over the first gap 13A.

Materials of the dielectric filler units 16 and the dielectric connecting feature 23 are similar to the dielectric filler units 16 described in step 104 of the method 100 with reference to FIG. 5, and the details thereof are omitted for the sake of brevity.

In some embodiments, the dielectric filler units 16 and the dielectric connecting feature 23 are formed by sub-steps of: (i) depositing the first dielectric material for forming the dielectric fillers 16 and the dielectric connecting feature 23 over the structure shown in FIG. 17 using CVD, ALD, or other suitable techniques; and (ii) performing a planarization process, such as CMP process or other suitable techniques to remove any excess first dielectric material (for example, the first dielectric material on the lower mask film 1232), thereby forming the dielectric filler units 16 and the dielectric connecting feature 23.

FIGS. 31 to 35 illustrate intermediate stages which are subsequent to that shown in FIG. 30 and which are respectively obtained in steps 306 to 310 of the method 300B in accordance with some embodiments. Since steps 306 to 310 with reference to FIGS. 31 to 35 are performed in a manner similar to those described with reference to FIGS. 19, 20, 8, 9 and 10, details thereof are not repeated for the sake of brevity.

The method 300B differs from the method 300 in that during formation of the dielectric filler units 16, the additional dielectric connecting feature 23 is also formed, and the first dielectric material deposited outside of the first gap 13 is removed using the planarization process, thereby obtaining the semiconductor structure 500. The semiconductor structure 500 differs from the semiconductor structure 200 in that the dielectric filler units 16 and the dielectric connecting feature 23 are formed as a continuous structure, whereas in the semiconductor structure 200 shown in FIG. 10, the dielectric filler units 16 are present as discrete components.

Figure 36:
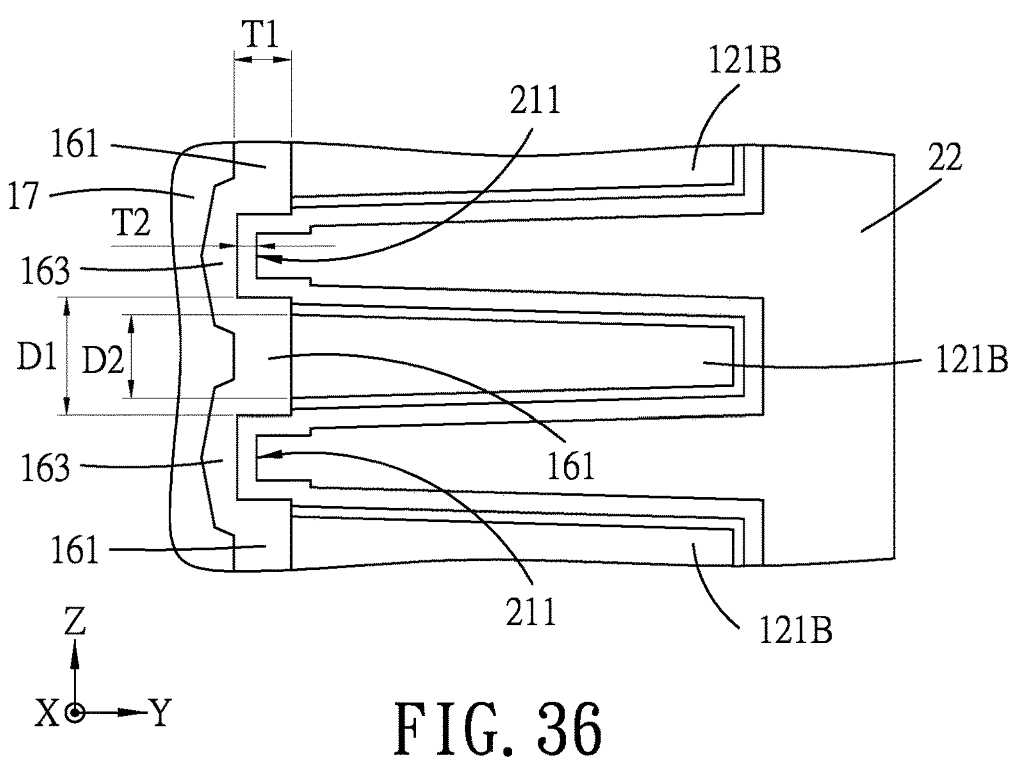

FIG. 36 is a partially enlarged view of FIG. 35. The descriptions regarding the first maximum dimension (D1), the second maximum dimension (D2), the maximum thickness (T1), and the dielectric thickness (T2) in FIG. 36 are similar to those described with reference to FIG. 11, and thus the details thereof are omitted for the sake of brevity.

Figure 37:
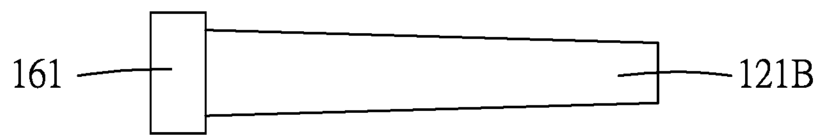
FIGS. 37 to 41 are schematic views illustrating variations of first dielectric fillers of the semiconductor structure in accordance with some embodiments.
Figure 37:
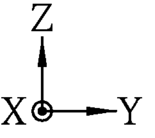
Figure 38:
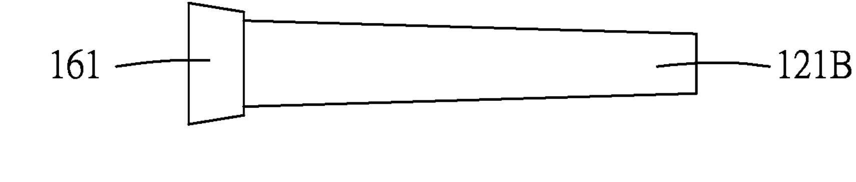
Figure 38:
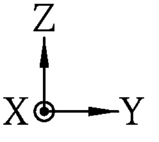
Figure 39:
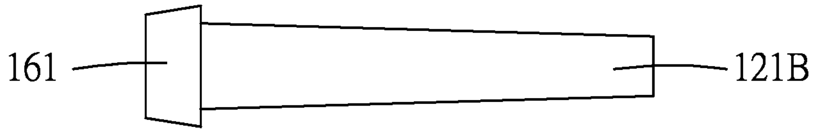
Figure 39:
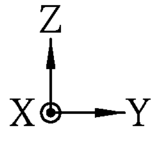
Figure 40:
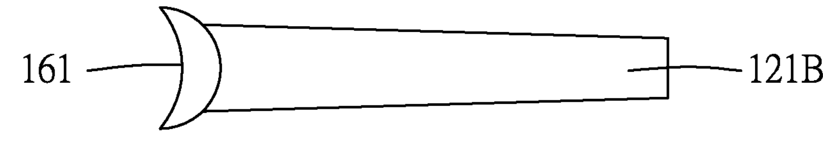
Figure 40:
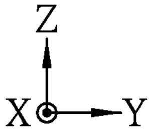
Figure 41:
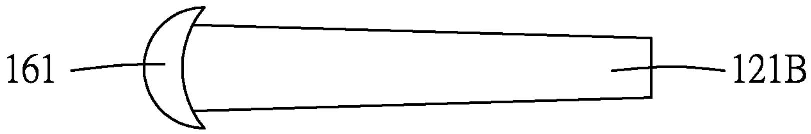
Figure 41:
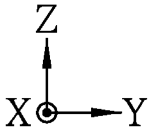

For the abovementioned methods 100, 300, 300A and 300B, each of the first and second dielectric fillers 161, 162, may be independently formed with a predetermined shape according to different requirements. For instance, in some embodiments, each of the first dielectric fillers 161 and the second dielectric filler 162 (if any) of each of the dielectric filler units 16 may have a cross-section in a shape of rectangular (see FIG. 37), trapezoid (see FIGS. 38 to 39), or meniscus (see FIGS. 40 to 41).

The embodiments of the present disclosure have the following advantageous features. By virtue of the introduction of the first dielectric fillers, each of the channel features is spaced apart from the dielectric wall by the corresponding one of the first dielectric fillers. Each of the dielectric portions which covers the corresponding channel feature and which extends toward the dielectric wall can extend beyond the end portion of the corresponding channel feature, so that improved control of the end portion of the corresponding channel feature and reduction of current leakage from the end portion of the corresponding channel feature can be achieved. In addition, the dielectric wall, and the sources and drains are less likely to be damaged during removal of the sacrificial features (so as to form the gate features), so as to avoid extrusion of gate features into the dielectric wall, or direct contact between the channel features and the dielectric wall. Moreover, the amount of undesirable residues may be reduced during formation of gate electrodes made of different materials.

In accordance with some embodiments of the present disclosure, a semiconductor structure includes a substrate, a dielectric wall and two device units. The dielectric wall has two side surfaces opposite to each other. The two device units are respectively formed at the two side surfaces of the dielectric wall. Each of the device units includes channel features, a gate feature and a dielectric filler unit. The channel features are disposed on a corresponding one of the side surfaces of the dielectric wall, and spaced apart from each other. The gate feature is formed around the channel features and disposed on the corresponding one of the side surfaces of the dielectric wall. The dielectric filler unit includes a plurality of first dielectric fillers, each of which is disposed between the dielectric wall and a corresponding one of the channel features. The first dielectric fillers have a dielectric constant greater than that of the dielectric wall.

In accordance with some embodiments of the present disclosure, the dielectric constant of the first dielectric fillers is greater than 7.

In accordance with some embodiments of the present disclosure, the first dielectric fillers are each independently made of silicon carbon nitride, silicon nitride, aluminum oxide, hafnium (IV) silicate, yttrium oxide, hafnium oxide, zirconium dioxide, tantalum oxide, lanthanum oxide, lanthanum aluminate, niobium oxide, titanium oxide, barium titanate, strontium titanate, and combinations thereof.

In accordance with some embodiments of the present disclosure, each of the device units further includes a fin disposed between the substrate and a bottommost one of the channel features. The dielectric filler unit further includes a second dielectric filler disposed between the dielectric wall and the fin.

In accordance with some embodiments of the present disclosure, the dielectric filler unit further includes a plurality of connecting portions disposed to alternate with the first dielectric fillers. A bottommost one of the connecting portion interconnects the second dielectric filler and a bottommost one of the first dielectric fillers. The semiconductor structure further includes a dielectric connecting feature which is made of a material the same as that of the dielectric filler unit and which interconnects the second dielectric fillers of the dielectric filler units of the two device units.

In accordance with some embodiments of the present disclosure, each of the device units further includes a fin that is disposed between the substrate and a bottommost one of the channel features and that is in direct contact with a corresponding one of the side surfaces of the dielectric wall.

In accordance with some embodiments of the present disclosure, the gate feature includes a gate electrode and a gate dielectric which is disposed to separate the gate electrode from the channel features and the dielectric wall. The gate dielectric has a plurality of dielectric portions disposed to alternate with the channel features. The dielectric portions each has a thickness. The first dielectric fillers are disposed to alternate with the dielectric portions in a Z direction. Each of the first dielectric fillers is in direct contact with an end portion of the corresponding channel feature, and has a maximum thickness which is in a Y direction transverse to the Z direction and which is not less than the thickness of each of the dielectric portions.

In accordance with some embodiments of the present disclosure, a semiconductor structure includes a substrate, a dielectric wall and two device units. The dielectric wall has two side surfaces opposite to each other. The two device units are respectively formed at the two side surfaces of the dielectric wall. Each of the device units includes channel features, a gate feature and a dielectric filler unit. The channel features are disposed on a corresponding one of the side surfaces of the dielectric wall, and spaced apart from each other in a Z direction. The gate feature are formed around the channel features and disposed on the corresponding one of the side surfaces of the dielectric wall. The gate feature includes a gate electrode and a gate dielectric which is disposed to separate the gate electrode from the channel features and the dielectric wall. The gate dielectric has a plurality of dielectric portions disposed to alternate with the channel features. The dielectric filler unit includes a plurality of first dielectric fillers, each of which is disposed between the dielectric wall and a corresponding one of the channel features. The first dielectric fillers are disposed to alternate with the dielectric portions in the Z direction. Each of the first dielectric fillers is in direct contact with an end portion of the corresponding channel feature, and has a first maximum dimension in the Z direction greater than a second maximum dimension of the end portion of the corresponding channel feature in the Z direction.

In accordance with some embodiments of the present disclosure, the first maximum dimension is greater than the second maximum dimension by at least 1.5 nm.

In accordance with some embodiments of the present disclosure, the dielectric portions each has a dielectric thickness. The first dielectric fillers each has a maximum thickness which is in a Y direction transverse to the Z direction and which is not less than the dielectric thickness of each of the dielectric portions.

In accordance with some embodiments of the present disclosure, the maximum thickness is greater than the dielectric thickness.

In accordance with some embodiments of the present disclosure, each of the first dielectric fillers has a cross-section in a shape of rectangular, trapezoid, or meniscus.

In accordance with some embodiments of the present disclosure, a method for manufacturing a semiconductor structure includes: forming a pair of stacks, the stacks being spaced apart from each other by a first gap, each of the stacks including a plurality of channel layers and a plurality of sacrificial layers; etching back the channel layers of each of the stacks through the first gap to form a plurality of first lateral recesses in each of the stacks; forming two dielectric filler units each including a plurality of first dielectric fillers that are respectively formed in the first lateral recesses of a corresponding one of the stacks; and forming a dielectric wall in the first gap such that each of the dielectric fillers is disposed between the dielectric wall and a corresponding one of the etched channel layers, the dielectric wall having two side surfaces confronting the stacks respectively, a dielectric constant of the dielectric wall being lower than that of the first dielectric fillers.

In accordance with some embodiments of the present disclosure, the method further includes patterning the two stacks after forming the dielectric wall such that the etched channel layers are formed into channel features and the sacrificial layers are removed; and forming two gate features, each of which is disposed around the channel features of a corresponding one of the patterned stacks and each of which is disposed on a corresponding one of the two side surfaces of the dielectric wall.

In accordance with some embodiments of the present disclosure, in forming the stacks, a plurality of pairs of stacks are formed, each two adjacent pairs of the stacks being spaced apart from each other by a second gap, the method further including: forming a masking material layer in the second gap prior to etching back the channels layers; and removing the masking material layer prior to forming the dielectric wall.

In accordance with some embodiments of the present disclosure, in forming the stacks, a plurality of pairs of stacks are formed, each two adjacent pairs of the stacks being spaced apart from each other by a second gap, the method further including: prior to etching back the channel layers, forming an isolation material layer which includes a first masking portion filling the first gap and a second masking portion filling the second gap; prior to etching back the channel layers, removing a portion of the first masking portion to expose the channel layers; and prior to forming the dielectric wall, removing a remaining portion of the first masking portion.

In accordance with some embodiments of the present disclosure, the remaining portion of the first masking portion is removed after forming the dielectric filler units.

In accordance with some embodiments of the present disclosure, the removal of the portion of the first masking portion and the removal of the remaining portion of the first masking portion are performed before forming the dielectric filler units.

In accordance with some embodiments of the present disclosure, the pair of the stacks are formed on a pair of fins, each of the fins being spaced apart by the first gap, during etching back the channel layers, each of the fins is etched back through the first gap to form a second lateral recess, and each of the dielectric filler units further includes a second dielectric filler formed in the second lateral recess of a corresponding one of the etched fins.

In accordance with some embodiments of the present disclosure, in forming the dielectric filler units, a dielectric connecting feature, which is made of a material the same as that of the dielectric filler units, is formed to interconnect the second dielectric fillers of the dielectric filler units such that the dielectric filler units and the dielectric connecting feature are formed as a continuous structure over the first gap.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate;

a dielectric wall having two side surfaces opposite to each other; and two device units respectively formed at the two side surfaces of the dielectric wall, each of the two device units comprising:

channel features disposed on a corresponding one of the two side surfaces of the dielectric wall, and spaced apart from each other, a gate feature formed around the channel features and disposed on the corresponding one of the two side surfaces of the dielectric wall, and a dielectric filler unit comprising a plurality of first dielectric fillers, each of which is disposed between the dielectric wall and a corresponding one of the channel features, the first dielectric fillers having a dielectric constant greater than that of the dielectric wall.

2. The semiconductor structure according to claim 1, wherein the dielectric constant of the first dielectric fillers is greater than 7.

3. The semiconductor structure according to claim 1, wherein the first dielectric fillers are each independently made of silicon carbon nitride, silicon nitride, aluminum oxide, hafnium (IV) silicate, yttrium oxide, hafnium oxide, zirconium dioxide, tantalum oxide, lanthanum oxide, lanthanum aluminate, niobium oxide, titanium oxide, barium titanate, strontium titanate, or combinations thereof.

4. The semiconductor structure according to claim 1, wherein:

each of the two device units further comprises a fin disposed between the substrate and a bottommost one of the channel features, and the dielectric filler unit further comprises a second dielectric filler disposed between the dielectric wall and the fin.

5. The semiconductor structure according to claim 4, wherein:

the dielectric filler unit further comprises a plurality of connecting portions disposed to alternate with the first dielectric fillers, a bottommost one of the connecting portions interconnects the second dielectric filler and a bottommost one of the first dielectric fillers, and the semiconductor structure further comprises a dielectric connecting feature which is made of a material the same as that of the dielectric filler unit and which interconnects the second dielectric fillers of the dielectric filler units of the two device units.

6. The semiconductor structure according to claim 1, wherein each of the two device units further comprises a fin that is disposed between the substrate and a bottommost one of the channel features and that is in direct contact with the corresponding one of the two side surfaces of the dielectric wall.

7. The semiconductor structure according to claim 1, wherein:

the gate feature comprises a gate electrode and a gate dielectric which is disposed to separate the gate electrode from the channel features and the dielectric wall, the gate dielectric has a plurality of dielectric portions disposed to alternate with the channel features, the dielectric portions each have a thickness, the first dielectric fillers are disposed to alternate with the dielectric portions in a Z direction, each of the first dielectric fillers is in direct contact with an end portion of the corresponding one of the channel features, and each of the first dielectric fillers has a maximum thickness which is in a Y direction transverse to the Z direction and which is not less than the thickness of each of the dielectric portions.

8. The semiconductor structure according to claim 1, wherein:

the channel features are spaced apart from each other in a Z direction, the gate feature comprises a gate electrode and a gate dielectric which is disposed to separate the gate electrode from the channel features and the dielectric wall, the gate dielectric has a plurality of dielectric portions disposed to alternate with the channel features, and the first dielectric fillers are disposed to alternate with the dielectric portions in the Z direction.

9. The semiconductor structure according to claim 1, wherein:

the channel features are spaced apart from each other in a Z direction, and each of the first dielectric fillers is in direct contact with an end portion of the corresponding one of the channel features.

10. The semiconductor structure according to claim 9, wherein each of the first dielectric fillers has a first maximum dimension in the Z direction greater than a second maximum dimension of the end portion of the corresponding one of the channel features in the Z direction.

11. The semiconductor structure according to claim 10, wherein the first maximum dimension is greater than the second maximum dimension by at least 1.5 nm.

12. The semiconductor structure according to claim 1, wherein the gate feature comprises a gate electrode and a gate dielectric which is disposed to separate the gate electrode from the channel features and the dielectric wall.

13. The semiconductor structure according to claim 12, wherein the gate dielectric has a plurality of dielectric portions disposed to alternate with the channel features.

14. The semiconductor structure according to claim 13, wherein:

the dielectric portions each have a dielectric thickness, the channel features are spaced apart from each other in a Z direction, and the first dielectric fillers each have a maximum thickness which is in a Y direction transverse to the Z direction and which is not less than the dielectric thickness of each of the dielectric portions.

15. The semiconductor structure according to claim 14, wherein the maximum thickness is greater than the dielectric thickness.

16. A semiconductor structure, comprising:

a substrate;

a dielectric wall having two side surfaces opposite to each other; and two device units respectively formed at the two side surfaces of the dielectric wall, each of the two device units comprising:

channel features disposed on a corresponding one of the two side surfaces of the dielectric wall, and spaced apart from each other, a gate feature formed around the channel features and disposed on the corresponding one of the two side surfaces of the dielectric wall, wherein:

the gate feature comprises a gate electrode and a gate dielectric which is disposed to separate the gate electrode from the channel features and the dielectric wall, and the gate dielectric has a plurality of dielectric portions disposed to alternate with the channel features, and a dielectric filler unit comprising a plurality of first dielectric fillers, each of which is disposed between the dielectric wall and a corresponding one of the channel features, the first dielectric fillers having a dielectric constant greater than that of the dielectric wall.

17. The semiconductor structure of claim 16, wherein:

the channel features are spaced apart from each other in a Z direction, and the first dielectric fillers are disposed to alternate with the dielectric portions in the Z direction.

18. The semiconductor structure according to claim 16, wherein:

the channel features are spaced apart from each other in a Z direction, and each of the first dielectric fillers is in direct contact with an end portion of the corresponding one of the channel features.

19. A semiconductor structure, comprising:

a substrate;

a dielectric wall having two side surfaces opposite to each other; and two device units respectively formed at the two side surfaces of the dielectric wall, each of the two device units comprising:

a fin, channel features disposed on a corresponding one of the two side surfaces of the dielectric wall, and spaced apart from each other, a gate feature formed around the channel features and disposed on the corresponding one of the two side surfaces of the dielectric wall, and a dielectric filler unit comprising:

a plurality of first dielectric fillers, each of first dielectric fillers disposed between the dielectric wall and a corresponding one of the channel features, the first dielectric fillers having a dielectric constant greater than that of the dielectric wall, and a second dielectric filler disposed between the dielectric wall and the fin.

20. The semiconductor structure according to claim 19, wherein:

the dielectric filler unit further comprises a plurality of connecting portions disposed to alternate with the first dielectric fillers, and a bottommost one of the connecting portions interconnects the second dielectric filler and a bottommost one of the first dielectric fillers.

* * * * *